United States Patent
Rinzan et al.

(10) Patent No.: US 11,929,270 B2
(45) Date of Patent: Mar. 12, 2024

(54) UNCONSUMED PRECURSOR MONITORING

(71) Applicant: INFICON, Inc., East Syracuse, NY (US)

(72) Inventors: Mohamed Buhary Rinzan, Manlius, NY (US); Chunhua Song, Jamesville, NY (US); Steve James Lakeman, Newbury Park, CA (US)

( * ) Notice: Subject to any disclaimer, the term of this patent is extended or adjusted under 35 U.S.C. 154(b) by 0 days.

(21) Appl. No.: 17/744,856

(22) Filed: May 16, 2022

(65) Prior Publication Data

US 2022/0285184 A1 Sep. 8, 2022

Related U.S. Application Data

(63) Continuation of application No. 16/633,025, filed as application No. PCT/US2018/047903 on Aug. 24, 2018, now Pat. No. 11,335,575.

(Continued)

(51) Int. Cl.
*H01L 21/67* (2006.01)
*C23C 16/44* (2006.01)
(Continued)

(52) U.S. Cl.
CPC .... *H01L 21/67253* (2013.01); *C23C 16/4401* (2013.01); *C23C 16/4412* (2013.01);
(Continued)

(58) Field of Classification Search
None
See application file for complete search history.

(56) References Cited

U.S. PATENT DOCUMENTS 6,079,252 A 6/2000 Tabler et al.
6,295,861 B1 10/2001 Tom et al.
(Continued)

FOREIGN PATENT DOCUMENTS

CN 104535282 A 4/2015
JP 2005077173 A 3/2005
(Continued)

OTHER PUBLICATIONS

JP 2020-511512, filed Aug. 24, 2018, INFICON, Inc., Japanese Office Action dated Jun. 28, 2022 (6 pages).
(Continued)

*Primary Examiner* — Alexander G Ghyka

(57) ABSTRACT

A monitoring device for monitoring a fabrication process in a fabrication system. The monitored fabrication system includes a process chamber and a plurality of flow components. A quartz crystal microbalance (QCM) sensor monitors one flow component of the plurality of flow components of the fabrication system and is configured for exposure to a process chemistry in the one flow component during the fabrication process. A controller measures resonance frequency shifts of the QCM sensor due to interactions between the QCM sensor and the process chemistry in the one flow component during the fabrication process. The controller determines a parameter of the fabrication process in the process chamber as a function of the measured resonance frequency shifts of the QCM sensor within the one flow component.

22 Claims, 14 Drawing Sheets

Related U.S. Application Data

(60) Provisional application No. 62/550,194, filed on Aug. 25, 2017, provisional application No. 62/550,226, filed on Aug. 25, 2017.

(51) Int. Cl.
    *C23C 16/455*     (2006.01)
    *C23C 16/52*     (2006.01)
    *G01N 29/02*     (2006.01)
    *G01N 29/036*     (2006.01)
    *H01L 21/285*     (2006.01)
    *H01L 21/66*     (2006.01)

(52) U.S. Cl.
    CPC ........ *C23C 16/45544* (2013.01); *C23C 16/52* (2013.01); *G01N 29/022* (2013.01); *G01N 29/036* (2013.01); *H01L 21/28556* (2013.01); *H01L 22/26* (2013.01); *G01N 2291/0255* (2013.01); *G01N 2291/0256* (2013.01)

(56) References Cited

U.S. PATENT DOCUMENTS

| | | | |
|---|---|---|---|
| 9,725,302 | B1 | 8/2017 | Tedeschi et al. |
| 11,335,575 | B2 * | 5/2022 | Rinzan .................... H01L 22/26 |
| 2004/0018650 | A1 | 1/2004 | Sasajima et al. |
| 2010/0086681 | A1 | 4/2010 | Ikuta et al. |
| 2010/0151599 | A1 | 6/2010 | Bai et al. |
| 2014/0053779 | A1 | 2/2014 | Martinson et al. |
| 2017/0004984 | A1 | 1/2017 | Nagaike et al. |
| 2017/0016859 | A1 | 1/2017 | Beccard et al. |
| 2018/0267086 | A1 * | 9/2018 | Rinzan .................... C23C 16/52 |

FOREIGN PATENT DOCUMENTS

| | | |
|---|---|---|
| JP | 2009098133 A | 5/2009 |
| JP | 20131455249 A | 7/2013 |
| KR | 101550290 B1 | 9/2015 |
| WO | 98/55667 A1 | 12/1998 |
| WO | 2016082351 A1 | 2/2016 |

OTHER PUBLICATIONS

CN 201880069715.9, filed Aug. 24, 2018, INFICON, Inc., Chinese Office Action dated Nov. 25, 2022 (14 pages).
CN 201880069715.9, filed Aug. 24, 2018, INFICON, Inc., English translation Chinese Office Action dated Nov. 25, 2022 (17 pages).
KR 2020-7005538, filed Aug. 24, 2018, INFICON, Inc., Korean Office Action dated Dec. 19, 2022 (4 pages).
KR 10-2020-7005538, filed Feb. 25, 2020, INFICON, Inc., Korean Office Action dated Jan. 20, 2022 (5 pages).
KR 10-2020-7005538, filed Feb. 25, 2020, INFICON, Inc., English translation of Korean Office Action dated Jan. 20, 2022 (4 pages).
SG 11202001588X, filed Aug. 24, 2018; INFICON< Inc. Singapore Examination Report dated Mar. 16, 2022 (5 pages).
Elam, J.W. et al; "Viscous flow reactor with quartz crystal microbalance for thin film growth by atomic layer deposition"; Review of Scientific Instruments, AIP, vol. 73, No. 8; Aug. 1, 2002; pp. 2981-2987, XP012040153, ISSN: 0034-6748, DO!: 10.1063/1.1490410.
Ryozo Takasu et al.; "New QCM Sensor for Real-time AMC Detection in SMIF Pods"; Semiconductor Manufacturing, 2006, ISSM 2006; Sep. 25, 2006; pp. 421-423; XP031244739; ISBNL 978-4-9904138-0-4.
Hiroyuki Matsumoto et al.; "Active oxygen detection using Quart Crystal Microbalance method under inductively coupled oxygen plasma"; Control, Automation and Systems, 2008; ICCAS 2008, International Conference On, IEEE, Oct. 14, 2008, pp. 2185-2188, XP031367848, IBSN: 978-89-950038-9-3.
Iwamori Satoru et al.; "Active oxygen sensors using a quartz crystal microbalance (QCM) with sputter-coated and spin-coated poly(tetrafluorethylene) thin films"; Sensors and Actuators B: Chemical, vol. 171, Jun. 6, 2012; pp. 769-776; Xp028932145, ISSN: 0925-4005, DOI: 10.1016/J.SNB.2012-05-070.
Kasemo, B. et al.; "Quartz crystal microbalance measurements of O/Ti and CO/Ti atom ratios on very than Ti films"; Surface Scienced, vol. 77, No. 2, Oct. 2, 1978, pp. 209-218; Xp025726785, ISSN: 0039-6028, DOI: 10.1016/0039-6028(78)90002-X.
EP 18 848 671.6; filed Aug. 24, 2018; INFICON, Inc.; European Search Report dated Mar. 15, 2021 (13 pages).
SG 11202001588X; filed Aug. 24, 2018; INFICON, Inc.; Singapore Search Report dated Apr. 6, 2021 (3 pages).
SG 11202001588X; filed Aug. 24, 2018; INFICON, Inc.; Singapore Written Opinion dated Apr. 12, 2021 (7 pages).
Nathan Marchak et al.; "In-Situ Etch Rate Study of HfxLayO$_z$ in Cl$_2$/BCl$_3$ plasmas using the quartz crystal microbalance"; Jornal of Vacuum Science & Technology A 33, 031305; Mar. 27, 2015; American Vacuum Society (11 pages).
Kurt J. Lesker Company; "INFICON Deposition Monitor & Controller Selection Guide"; Jun. 1, 2007; retrieved from the Internet https://www.lesker.com/newweb/process_instruments/processequipment_inficon_selectionguide.cfm (2 pages).
PCT/US2018/047903; International Filing Date Aug. 24, 2018; International Search Report and Written Opinion; dated Oct. 29, 2018 (11 pages).
IL 272839; filed Aug. 24, 2018; INFICON, Inc.; Israel first Official Action, dated Jul. 10, 2022 (4 pages).
KR 2020-7005538; filed Aug. 24, 2018; INFICON, Inc.; Korean Final Official Action, dated Jul. 28, 2022 (4 pages).
European Patent Office, Office Action from corresponding European Patent Application No. 18 848 671.6, dated Jul. 17, 2023 (6 pgs.).
CNIPA, Office Action from corresponding Chinese Patent Application No. 201880069715.9, dated Aug. 19, 2023 with English translation (10 pgs.).

* cited by examiner

UNCONSUMED PRECURSOR MONITORING

CROSS-REFERENCE TO RELATED APPLICATIONS

This application is a continuation of U.S. patent application Ser. No. 16/633,025, to be issued as U.S. Pat. No. 11,335,575, which is a national stage application pursuant to 35 U.S.C. § 371 of International Application No. PCT/US2018/047903 filed on Aug. 24, 2018, which claims priority to, and the benefit of, U.S. Provisional Patent Application No. 62/550,194 and U.S. Provisional Patent Application No. 62/550,226, each filed on Aug. 25, 2017. The entire contents of such applications are hereby incorporated by reference.

BACKGROUND

The present disclosure relates to methods and systems for monitoring fabrication systems using one or more quartz crystal microbalances (QCM) sensors.

In the semiconductor industry and microelectronics manufacturing there is a need to monitor fabrication processes, for example to detect air leaks during wafer processing. The electrical properties of critical layers in a wafer full of devices may be affected by unintentional doping due to oxygen uptake and material modification due to chemical reaction as a result of leaks. For example, some materials like titanium, in semiconductor fabrication, and magnesium or organic materials, in organic light-emitting diode (OLED) manufacturing, highly react with constituents in air. To mitigate loss, many tools use a single centralized expensive air leak sensor such as residual gas analyzer or optical emission spectrometer mounted on the transfer chamber to monitor air leaks continuously and during wafer transfers when the chamber slit-valve is open. The transfer chambers where the sensor is mounted remains isolated to the process chamber during wafer processing, hence any potential air uptake on the processed wafers would not be known until an ex-situ metrology sensor detects it on an audit wafer. Conventional techniques can lead to expensive wafer scraps in the event of an air-leak. Besides their high price, the conventional sensors may not be suitable for many processes for reasons such as chemical compatibility, pressure, and temperature.

The foregoing background describes some, but not necessarily all, of the problems, disadvantages and shortcomings related to the known research, development and design tools and methods.

SUMMARY

In an embodiment, a monitoring device for monitoring a fabrication process in a fabrication system is presented. The monitored fabrication system includes a process chamber and a plurality of flow components. A QCM sensor monitors one flow component of the plurality of flow components of the fabrication system and is configured for exposure to a process chemistry in the one flow component during the fabrication process. A controller measures resonance frequency shifts of the QCM sensor due to interactions between the QCM sensor and the process chemistry in the one flow component during the fabrication process. The controller determines a parameter of the fabrication process in the process chamber as a function of the measured resonance frequency shifts of the QCM sensor within the one flow component.

In an embodiment, presented herein is a monitoring device for monitoring a fabrication process in a fabrication system is presented. The monitored fabrication system includes a process chamber and a plurality of flow components including an exhaust line or a supply line. A QCM sensor monitors the exhaust line or the supply line of the plurality of flow components of the fabrication system and is configured for exposure to a process chemistry in the exhaust line or the supply line during the fabrication process. A controller measures resonance frequency shifts of the QCM sensor due to interactions between the QCM sensor and the process chemistry in the exhaust line or the supply line during the fabrication process. The controller determines a parameter of the fabrication process in the process chamber as a function of the measured resonance frequency shifts of the QCM sensor within the exhaust line or the supply line. The process chemistry in the exhaust line or the supply line during the fabrication process includes at least one of an unconsumed precursor or a reaction byproduct of the fabrication process in the process chamber. A mass of the QCM sensor changes due to the unconsumed precursor or the reaction byproduct. The controller determines the parameter of the fabrication process in the process chamber due to the measured resonance frequency shifts of the QCM sensor indicating the changing mass of the QCM sensor.

In an embodiment, a method for monitoring a fabrication process in a fabrication system is presented. The monitored fabrication system includes a process chamber and a plurality of flow components. A quartz crystal microbalance (QCM) sensor for monitoring one flow component of the plurality of flow components of the fabrication system is deployed. The QCM sensor is exposed to a process chemistry in the one flow component during the fabrication process. Resonance frequency shifts of the QCM sensor due to interactions between the QCM sensor and the process chemistry in the one flow component during the fabrication process are measured. A parameter of the fabrication process in the process chamber is determined as a function of the measured resonance frequency shifts of the QCM sensor within the one flow component.

Additional features and advantages of the present disclosure are described in, and will be apparent from, the following Brief Description of the Drawings and Detailed Description.

DETAILED DESCRIPTION

The present disclosure relates to monitoring systems that make use of quartz crystal microbalance (QCM) sensors, e.g., for monitoring fabrication processes, such as semiconductor or other fabrication processes.

Figure 1A:
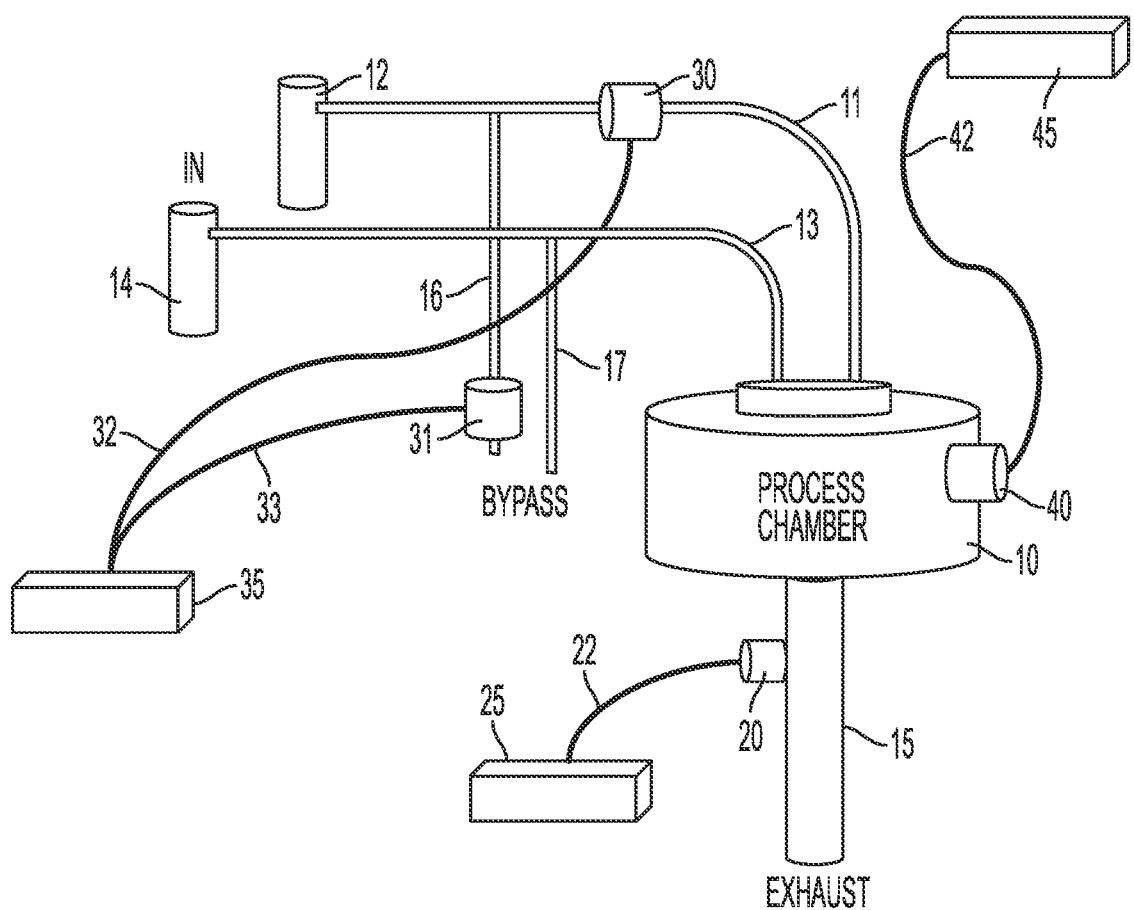
FIG. 1A depicts an embodiment of a system for monitoring a fabrication process.

FIG. 1A depicts an embodiment of a system for monitoring a fabrication process. In the embodiment of FIG. 1A, a process chamber 10 is connected via supply line 11 to a source 12, such as a precursor source. The process chamber 10 is also connected via supply line 13 to another source 14, and an exhaust line 15. Each of the lines may also include one or more valves that may be controlled by a process controller (not shown).

In the embodiment of FIG. 1A, bypass lines 16 and 17 may be used to shunt a portion of the process chemistry in the system to one or more sensors. In an embodiment, a QCM sensor 20 may be used to monitor the exhaust line 15, and may be connected by line 22 to components 25 for processing. Similarly, a QCM sensor 30 may be used to monitor the supply line 11, or a QCM sensor 31 may be used to monitor the bypass 16 to the supply line 11, and may be connected by lines 32, 33, respectively, to components 35 for processing. Further, a QCM sensor 40 may be used to directly monitor the process chamber 10 and may be connected by line 42 to components 45 for processing.

A person of ordinary skill in the art would understand that the present techniques may be employed on a wide variety of different fabrication process systems, and one or more QCM sensors and affiliated circuitry and components (such as heaters, controllers, material deposition units, etching units, etc.) could be deployed in one or more locations in the fabrication system.

For instance, the system could be used to determine if any of the following conditions are present in the chamber: an air leak, a reaction byproduct, an unconsumed precursor, or a contaminant. Advantageously, such a determination may be made by the system without a QCM sensor being deployed directly in the process chamber.

In addition, a QCM sensor may be deployed in one or more of a variety of locations in the system, including, but not limited to a pumping line, an exhaust line, a supply line, a bypass line, a valve body, a vacuum plenum, a bypass chamber or a transfer chamber.

Figure 1B:
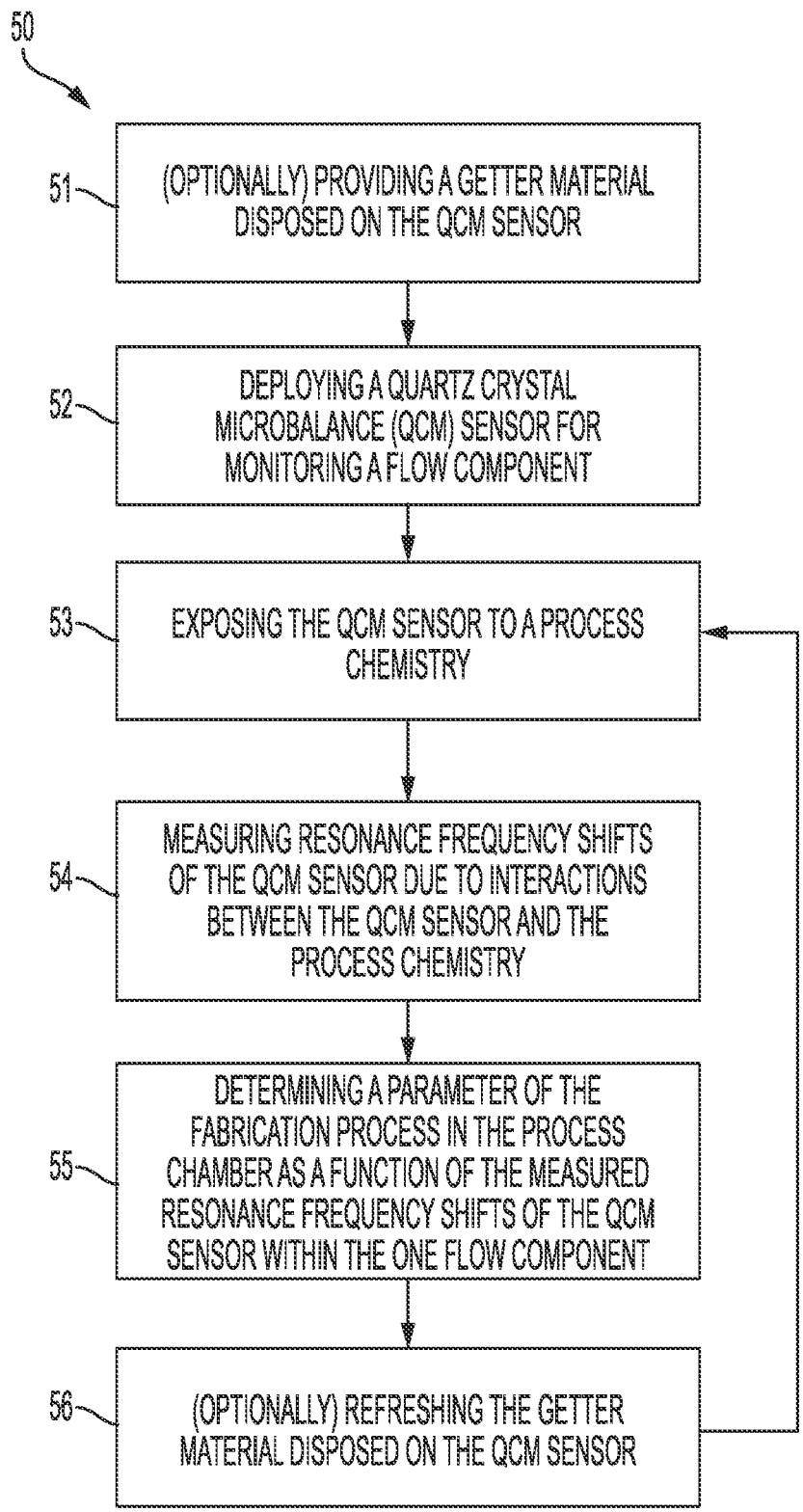
FIG. 1B is a flowchart illustrating an embodiment of a method for monitoring a fabrication process.

FIG. 1B is a flowchart illustrating an embodiment of a method 50 for monitoring a fabrication process. In the embodiment of FIG. 1B, the method 50 at block 51 optionally first provides a getter material disposed on a QCM sensor. In one example, the getter material may be disposed on the QCM sensor before the QCM sensor is installed in the fabrication system.

In another example, the fabrication process tools themselves may be used to provide the getter material on the QCM sensor. For instance, fabrication chemistry may be diverted from the fabrication system to the QCM sensor to deposit the getter material with a specified thickness on the QCM sensor.

In a further example, dedicated material deposition source, such as a titanium sublimation component, may be used to provide the getter material to the QCM sensor after installation.

In yet another example, the getter material may be protected by a sacrificial layer or another material, which is removed after installation of the QCM sensor. In such a case, a material removal component, such as an etching device, may be part of the monitoring system, and may be used to remove the sacrificial or other material layer from the QCM sensor after installation in the fabrication system.

Next, at block 52 of the method 50, a QCM sensor for monitoring one flow component of a plurality of flow components of the fabrication system is deployed within the fabrication system, as described above with respect to FIG. 1A. Continuing, at block 53 of the method 50, the QCM sensor is exposed to a process chemistry in the one flow component during the fabrication process. During, or after exposure, at block 54 of the method 50, resonance frequency shifts of the QCM sensor due to interactions between the QCM sensor and the process chemistry in the one flow component during the fabrication process are measured.

Then, at block 55 of the method 50, a parameter of the fabrication process in the process chamber is determined as a function of the measured resonance frequency shifts of the QCM sensor within the one flow component. For example, a mass of the getter material can change due to the interactions with the process chemistry in the one flow component during the fabrication process, and the controller can determine an air leak in the process chamber due to the measured resonance frequency shifts of the QCM sensor indicating the changing mass of the getter material in the one flow component.

Conceptually, the steps from blocks 53-55 may be viewed as a single iteration of a production process that is monitored by the system. Then, after this iteration, at block 56 of the method 55, the getter material may be refreshed.

In another embodiment, the method may be used to monitor for unconsumed precursors or reaction byproducts in the chamber. For example, a mass of the QCM sensor may change due to the unconsumed precursor or the reaction byproduct. In such a case, the controller can determine the parameter of the fabrication process in the process chamber due to the measured resonance frequency shifts of the QCM sensor indicating the changing mass of the QCM sensor.

Different types of fabrication processes may be monitored, including processes to add materials or remove materials to a wafer in a chamber. In such cases, the monitoring system monitors the deposition rate, or removal rate, respectively, occurring in the process chamber.

In one example, the system includes a heating device for adjusting a temperature of the QCM sensor. Such a configuration allows interactions between the QCM sensor and the process chemistry to occur at different rates, facilitating measurement. For instance, deposition or removal on the QCM sensor may be initiated or controlled due to the temperature.

In another example, the system may be arranged so that only a smaller portion of the process chemistry reaches the QCM sensor. The limited exposure of the QCM sensor to the process chemistry can serve to reduce the interactions between the QCM sensor and the process chemistry. This may be achieved by using a valve or orifice, or by using a dilution gas to dilute the process chemistry seen at the QCM sensor.

Figure 1C:
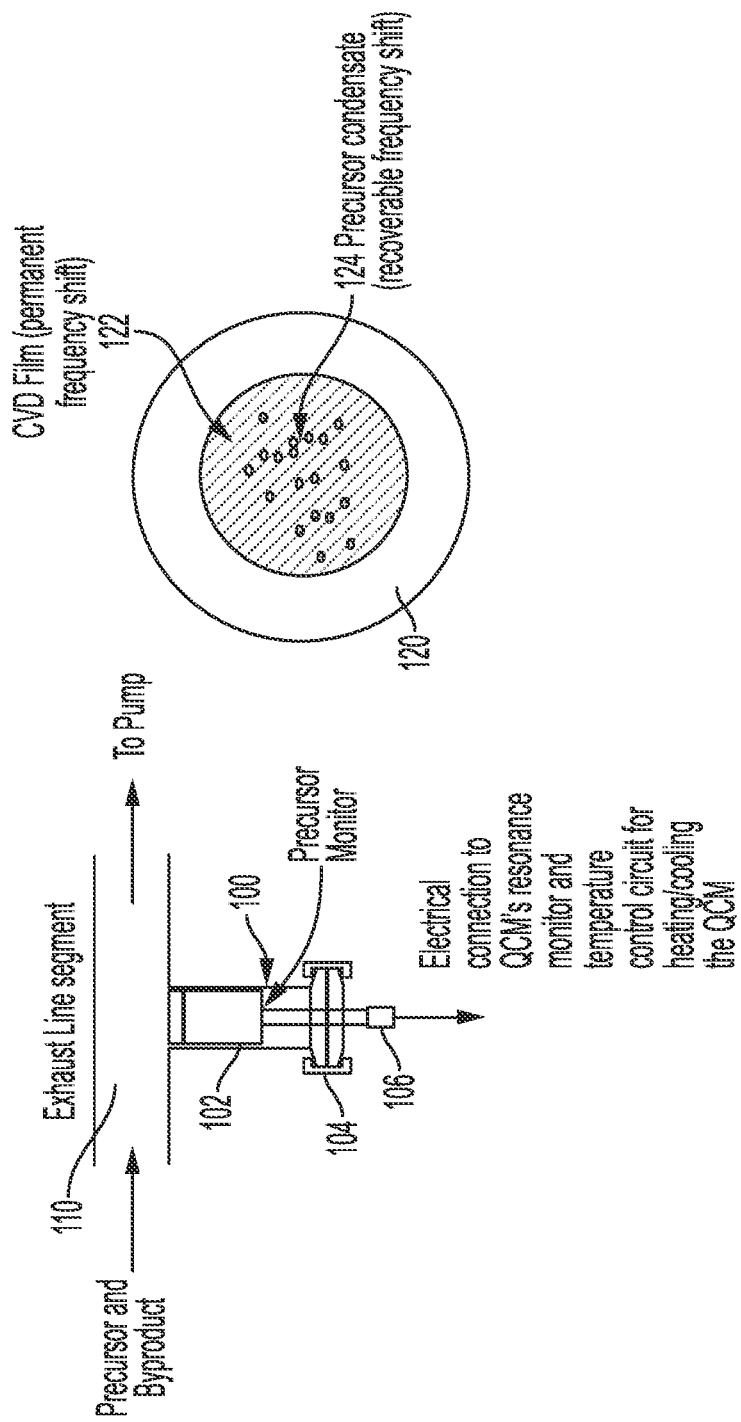
FIG. 1C depicts an embodiment of a system for monitoring unconsumed precursor or reaction products.
Figure 1D:
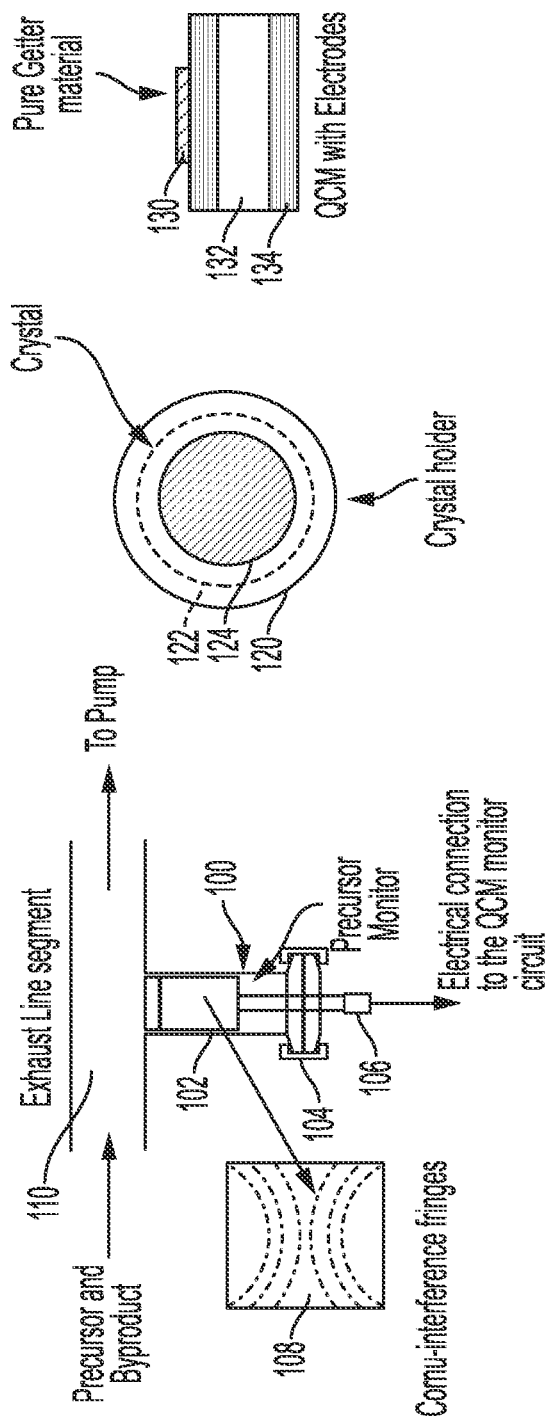
FIG. 1D depicts an embodiment of a system for detecting chamber air leaks.

FIGS. 1C & 1D depict embodiments of monitoring systems and methods using QCM sensors. The embodiment of FIG. 1C relates to monitoring unconsumed precursors and/or reaction byproducts, and the embodiment of FIG. 1D relates to chamber air leak and other contaminant detection.

Starting first with embodiment of FIG. 1C, this embodiment offers numerous advantages over conventional techniques. First, it is not seeking to simply reproduce the deposition effects as they are occurring on the wafer. Rather, the systems (which may include one or more QCM sensors) is looking to extract diagnostic value from residual precursor (process gases) and gases that are the byproduct of chemical reactions on and about the wafer surface. In the case of residual precursor gas, the technique does not try to simply replicate wafer process and it does not seek to simply monitor in a location that affords exposure of the sensor to process gas flows that approximate what the wafer is exposed to. Instead, the technique makes use of unconsumed precursor. These are typically very small amounts of gas, often trace amounts, which flow across the wafer but fail to react with the wafer surface. Alternatively, or in addition to, there are byproducts of reactions that do result from the interaction of process gases with the wafer surface. Metalorganic precursors, for example, can be structured from large organic molecules that thermally decompose or react with heated surfaces in and about the chamber. Unconsumed precursor gases and reaction byproducts can accumulated on surfaces inside the process chamber, pumping lines evacuating the chamber and pumps providing vacuum for the chamber. Anything within the vacuum envelope is susceptible to coating by these materials. Unconsumed precursor gases and reaction byproducts can yield information. They are detectable downstream. The technique is looking to make use of unconsumed precursor gases that are residual of wafer surface reactions and byproducts of chemical reactions that occur on the wafer surface.

Controlling the amount of organic and inorganic metal precursor concentration that is required to saturate large wafer surface for deposition coverage is critical in ALD and CVD processes. As a measure of safety the chamber is often filled with more than the saturation dosage (concentration times time) for the reaction to occur everywhere on the wafer. In a production tool it is required to be prudent in setting over-dosage limits as materials are often expensive. In addition, unnecessarily high gas flow, or in the case of ALD, gas pulse increase process cycle times and limit wafer throughput.

Installing sensors, for example, mass flow controllers or any other sensors on the precursor flow line to monitor items a)-e) (set forth below) is not practical due to concerns of contaminants or particles getting in to the process chamber. However, a sensor can be used downstream to monitor the above. Here, we demonstrate the potential to monitor a)-e) using a QCM sensor installed on the exhaust line, foreline, and the chamber or any other precursor or byproduct flow paths of CVD/ALD chambers used in metal oxides, nitrides or other material coating.

Thus, in one aspect, the present disclosure advantageously provides:

a) Precursor depletion;
b) Precursor Waste;
c) Precursor flow inhibition or fluctuation due to valve malfunctions;
d) Wafer temperature consistency; and
e) Precursor uptake consistency due to any other reasons that are attributed to the wafer itself, the chamber, equipment subsystems, incorrect process recipes or any other factor that leads to improper deposition.

A QCM may be used to monitor thin films in vacuum deposition. The resonance frequency of a QCM decreases with the mass loading of film deposits. Using the frequency down-shift of the QCM, density, and the acoustic impedance of the films formed on a QCM, the thickness, and hence, the rate of film formation can be derived.

Manufacturers of Semiconductor tools provide the best known method (BKM) for a process with a small variance in process parameters. Producing wafers with the provided process parameter set insures close to copybook deposition/etch rates and coverage for wafers. In order to ensure coverage and to reduce waste a frugal volume of precursor affluence is maintained. On its way to the exhaust, a small amount of precursor affluence and byproducts deposits on the liners, walls, exhaust lines. Although the temperatures downstream of the process are maintained to mitigate both decomposition of precursors and condensation of precursors and byproducts, it is impractical to avoid both. The wall temperatures are generally maintained to avoid precursor condensation and any condensates formed evaporate during purge cycles. Nevertheless, metal atoms condensation from precursor decomposition and scattered atoms arriving at the walls forms a permanent metal film on the wall. A QCM can be mounted flushed with the inner surface of the exhaust line/chamber wall to capture such film formation due to precursor affluence and byproducts.

During wafer processing, the amount of precursors that flow into the chamber is controlled as precisely as possible. Similarly, all other variables that influence reactions on the wafer surface are intended to be repeated wafer after wafer within very tight tolerances. In situ measurement of process consistency from one wafer to the next can be used to mitigate wafer loss, improve product yield and otherwise manage or control process consistency. QCMs can provide such measurement.

During wafer cycling the resonance frequency would shift if there is any deposition either in the form of metal from the metal precursor or metal oxides/nitrides or any other materials. The magnitude of the shift indicates if there was any effectively unconsumed precursor, byproducts, combination of both. This information can be processed to readily derive the thickness of the film. The magnitude of the shift is a measure of the wafer process consistency. The location and the temperature of the QCM can be selected to accumulate the above coating at a desired rate so that a single QCM can be used to last the entire production run or until the next preventive maintenance. The frequency shift so selected can be used as a figure of merit to indicate process consistency, correlate wasted/unused amount of precursor volume per wafer cycle or otherwise improve process consistency and optimization.

Other means of managing crystal lifetime include the use of dilution gases to reduce the concentration of material reaching the crystal surface and intermittent isolation of the QCM, e.g. behind a valve, to selectively limit exposure of the QCM to deposition of unconsumed precursor gas and reaction byproducts.

In one example, the system monitors wafer temperature consistency. In another example, the system monitors precursor uptake consistency due to any other reasons that are attributed to the wafer itself, the chamber, equipment subsystems, incorrect process recipes or any other factor that leads to improper deposition.

Continuing with FIG. 1C, the depicted system for monitoring unconsumed precursors or reaction byproducts generally shows a segment of a TiNi CVD-chamber exhaust line showing typical placement of an exhaust mounted QCM sensor. Continuing in detail with the embodiment of FIG. 1C, a QCM sensor 100 is mounted on a KF-40 flange of the exhaust line 110 of a pulsed CVD chamber. There can be more than one such sensor installed in different chambers running a similar or a different process on the same tool. There also can be more than one detector mounted in different locations of a single foreline of one chamber for the purpose of sensing unconsumed precursor or reaction byproducts. In the current example, a single sensor is mounted such that the crystal front face is almost on the same plane as the inner wall of the foreline. In order to accumulate a metal or metal nitride coating on the QCM 120, it may not be mandatory to mount the sensor in the shown configuration. The QCM 120 communicates via electronical connection 106 to, for example, a control system. Eddy currents produced about the sensor due to the cylindrical spacing between the nipple on the foreline and the sensor body itself may cause an inward draft of gas stream causing the metal vapors/precursors to reach well inside the nipple-tunnel. In addition, a QCM sensor includes a crystal 120, and an optional getter material. During operation, a CVD film 122 and a precursor condensate 124 may form. Depending on the temperature the accumulation on the QCM can be a mixture of film and precursor condensates or only the film.

Next, FIG. 1D illustrates a leak monitor embodiment. QCM sensors may be used to measure thickness accumulation rate in physical vapor deposition such as electron beam evaporation and thermal evaporation. The resonance frequency of a QCM decreases with material mass loading and the magnitude is proportional to the bare quartz frequency and the areal density of the foreign material. In the current technique, the QCM detects the mass gain of a pre-existing coating upon reacting to constituents in an air leak. The mass gain is a function of getter material thickness, partial pressure of the reacting component, temperature, and the surface roughness of the film on the crystal. The getter material is accumulated during the wafer production, hence; remain in its pure form in the absence of any air leaks or processes involving reacting components such as oxygen.

QCM sensors can be placed at various locations in and about the process chamber to monitor leaks. This includes locations that provide direct access for monitoring material deposition on chamber walls, in pumping lines leading from the chamber, on process gas supply lines, including bypass or divert lines that allow excess process gases to be channeled around the process chamber, in valve bodies attached to the chamber or any subsystem and in adjacent vacuum chambers, such as vacuum plenums and wafer transfer chambers, where periodic exposure due to valves opening and closing may allow the transfer of material from one chamber to another.

A QCM sensor mounted down-stream or in a bypass line relative to an expensive semiconductor wafer process location, for example the exhaust line of a tool chamber, is used to detect both unintentionally systematic and accidental air-leaks during semi-wafer production runs. The primary purpose of the QCM sensor is to function as an air leak detector where the detection is enabled by the mass gain due to oxidation of a pure getter metal coating accumulated on a QCM real time during production. If air molecules are present in the gas stream passing over the QCM, the resonance frequency of the QCM shifts downward, indicating a mass gain of the film due to oxidation.

Conventionally, bulk and surface getters such as non-evaporable sintered bulk media or thin film surface coatings are used as chemical getter pumps inside a sealed volume for operation of devices that require a high vacuum background. Upon activation inside the sealed volume, these mini chemical pumps help maintain the high vacuum level, provided externally at the time of sealing, by establishing an equilibrium between continuous background leaks and the sorption rate by the getter. Such getter mediums are always attached to a heater for their initial activation and to regenerate when their pumping efficacy deteriorates over time. After a few regeneration cycles, these getters need to be replaced from the sealed volume. The getter coating of current technique is used for real time leak detection and need no activation or regeneration. For example, in one embodiment, the system utilizes the precursor affluence of a semiconductor wafer production chamber, that is otherwise wasted, to continually accumulate the highest purity getter material to be used for the prime purpose of accidental air leak detection in the chamber without having the need for activation or regeneration methods and accessories.

In one aspect, the system accumulates the material on to a sensitive QCM for real time monitoring of the pure getter thickness growth, translated as leak detection efficacy of the QCM. In another aspect, the system uses passive and active real-time in situ air leak detection without having to run qualification wafers and ex-situ measurements. In a further aspect, the system a continually refreshing getter surface front at each wafer cycle guarantees surface diffusion limited oxidation at the least.

In another embodiment, the system provides wafer-wafer on-demand leak check features. For instance, the system offers the ability to ramp and integrate frequency shift signal to verify suspected small leaks using differential bins. In addition, the system provides directional leak rate check using two sensors. Further, the system includes a permanent chamber $O_2$ level history, including number of preventive maintenance, recorded in the Ti layer to aid failure and root cause analysis. In another example, the system includes passive or active getter material accumulation on to the QCM(s).

In gas phase metal and metal dielectric deposition, such as Chemical Vapor Deposition (CVD) and Atomic Layer Deposition (ALD), a precursor dose (the product of precursor concentration and exposure time) in excess of the critical dosage (required for the full wafer film thickness uniformity) is maintained. During wafer production runs, however, only a frugal excess dosage is maintained to reduce wastage of expensive precursors. On its way to the exhaust, precursors unconsumed by the wafer and process byproducts deposit on the liners, walls, and exhaust lines, etc., of the chamber. These deposits may take the form of condensations, parasitic films, and rigid elastic films. Equipment engineers try to maintain conditions downstream of the process to minimize these deposits. Especially, the exhaust and bypass line temperatures are maintained to minimize thermal decomposition and vapor saturation for a given precursor and pressure swing windows in recipe steps. However, it is impractical to completely avoid neither rigid metal film formation nor the precursor condensation. In most chambers, the wall temperatures of foreline are generally maintained to avoid precursor condensation. Any residual condensation is small and tends to evaporate during purge events, recipe steps with reduced foreline pressure, and pump downs. On the other hand, metal or dielectric film coatings remain permanently. The continuous accumulation of depositions that form these films may be due to metal vapor condensation. Depending on the combination of non-vanishing decomposition probability (due to temperature gradient between chamber internals and foreline) of precursors, the moderate mean free paths of metal vapors (~20 mm at a pressure of 10 mTorr), and the temperature of the foreline, the coating thickness accumulation rate may vary along the foreline. Yet, the above factors provide the source and means to form metal films even on a section of foreline wall that is at room temperature. Therefore, a QCM sensor can be placed in a suitable location in the foreline to monitor the metal accumulation rate and to detect potential air leaks using the getter properties of such accumulated materials. This also provides a handle to change the accumulation rate in favor of detecting chamber air leaks.

FIG. 1D depicts a system for detecting chamber air leaks and generally shows a segment of a TiNi CVD-chamber exhaust line showing typical placement of an exhaust mounted QCM sensor. The pure getter material was formed during production wafer monitoring as a result of precursor affluent passing over QCM surface on its way to the pump.

Continuing in detail with the embodiment of FIG. 1D, a QCM air leak detector 100 is mounted on a KF-40 flange of the exhaust line 110 of a pulsed CVD chamber. There can be more than one such detector installed in different chambers running a similar or a different process on the same tool. There also can be more than one detector mounted in different locations of a single foreline of one chamber for the purpose of extracting potential air leak direction and a co-relatable leak magnitude at the wafer site of the chamber. In the current example, a single sensor is mounted such that the crystal front face is almost on the same plane as the inner wall of the foreline. In order to accumulate a metal, metal oxide, or metal nitride coating on the QCM 120, it may not be mandatory to mount the sensor in the shown configuration. Eddy currents produced about the sensor due to the cylindrical spacing between the nipple on the foreline and the sensor body itself may cause an inward draft of gas stream causing the metal vapors/precursors to reach well inside the nipple-tunnel. The colorful Cornu-interference fringes 108 observed on the cylindrical sensor body 102 of an air leak detector withdrawn from a pulsed CVD chamber confirms the presence of such inward draft. In addition, a QCM sensor includes a crystal holder 120, a crystal 122 and a getter material 124. The sectional view of QCM 132 with the accumulated getter material 130 before exposure to an air leak is shown on the right. The area of the getter accumulation more than sufficiently covers the active area of the QCM.

Therefore it is possible to configure a) air leak detector with the QCM face recessed from the foreline wall, b) Two air-leak detectors with QCM facing each other on a T-section with the T-mounted to foreline nipple. Alternatively, the leak sensor may also use smaller diameter QCMs (for example 8 mm) to allow integration on KF25 or smaller nipples and other ports on fore-lines. The detectors can be either passive or active where the passive detector is at thermal equilibrium at the foreline wall temperature and the active detector can be heated to be at a different steady state temperature than the foreline. In the case of passive sensors, the frequency stability of the crystal is maximized by using QCMs designed to have a turning point at or very close to the temperature of installed location. In the case of active sensors, the temperature can be controlled at a fixed point for QCMs with any turning points.

Again, FIG. 1D shows a typical getter metal accumulation on the front face of the crystal of air leak detector. In the example shown elsewhere in this application, a pure Titanium film was incrementally accumulated from the affluent precursor dose passing (for example TDMAT) over during wafer cycling. As mentioned above, there is some amount of precursor decomposition available in the exhaust line of many CVD/ALD semi process tools. During each precursor pulse a mixture of metal vapor and unconsumed precursor condensate on the QCM surface. The pure metal condensates to form a pure getter surface, registering an irreversible frequency shift on the QCM. Meanwhile, the precursor condensation may evaporate during purge cycles in a recipe. The pure metal accumulation rate can be controlled by a combination or either of a) heating a segment of foreline few scattering wavelengths upstream of the QCM sensor b) heating the QCM to a fixed temperature.

CVD production chambers of Titanium, Tantalum and their dielectrics, or other CVD/ALD metals with getter properties and those metal based dielectrics benefit from this technique. QCM sensors mounted in the fore-lines of any of these chambers may have coatings to various degrees. Getter coatings are highly reactive to oxygen and less reactive to other components in air. Getter films can adsorb $O_2$, $N_2$, $H_2O$, etc. Depending on the getter-adsorbate combination these air molecules can be either physisorbed, diffused through, or chemisorbed. Although $O_2$, $N_2$, and $H_2O$ can react with Titanium, Oxygen has the highest reactivity and the sticking coefficient, hence; it can displace other adsorbates from both the getter metal surface and oxide scale formed.

In order to evaluate the effectiveness of the proposed air-leak detector its capabilities needs to be understood under different chamber conditions. For the sake of convenience, some of the results shown below were obtained using air, ultra-high-purity (UHP) nitrogen, and UHP oxygen exposure of Ti metal deposited on QCMs using a physical vapor deposition system.

Figure 2:
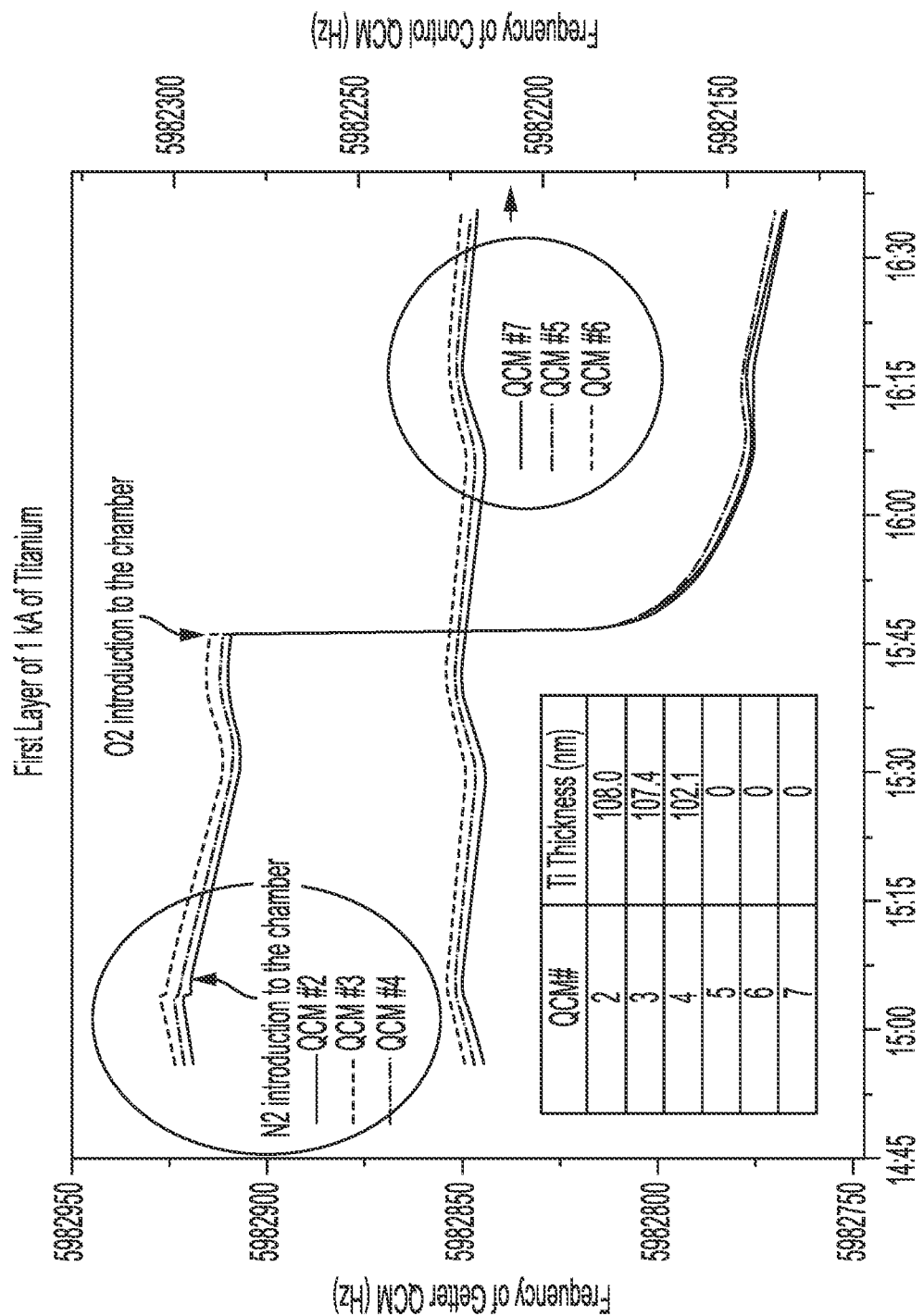
FIG. 2 is a graph of the frequency response of the system of FIG. 1D upon the introduction of different gases.

FIG. 2 shows frequency shifts in 3 AT-cut QCMs coated with Ti, and generally depicts UHP Nitrogen and UHP Oxygen introduction in to the evaporation chamber with three pure Titanium coated crystals and three control crystals. The $N_2$ introduction showed small frequency response (negligible for Ti thickness of 100 nm or less) while the exposure to $O_2$ showed a significant change in the frequency. Between the two exposures at 140 mT, the chamber was pumped down to base pressure.

Here, the metal film was applied using eBeam evaporation of 99.99% Titanium pallets at ultra-high vacuum. The chamber pressure at deposition is around $10^{-6}$ Torrs. The chamber is pumped by a Cryopump for efficient capture of water molecules desorbed from walls. Also, the pure Titanium coating accumulated on the bell jar surface of the evaporator during evaporation runs acts as a large surface getter pump to further boost the vacuum levels. Therefore, it is safe to assume the incorporation of water and other molecules in to the evaporated Ti coating on to the QCMs is negligible. The same QCMs were used for both measuring the thickness of the Ti deposit and the mass gain during exposure to $N_2$ and $O_2$ gases. A separate control QCM was used to control the evaporation rate at 1-1.5 A/s. After deposition the crystals were allowed to cool down to room temperature over 3-4 hours under high vacuum. After establishing a stable frequency baseline for QCMs, high purity gases were introduced in to the chamber using a variable leak rate valve. During such introduction it was ensured that there was no dead air volume trapped in the line connecting gas bottle to the chamber. Three more QCMs covered by a shutter to block metal deposition, but exposed to gases were used as experiment controls. The oscillations riding on the frequency as shown in the figure is due to QCMs response to building temperature control loop. For a pure Ti thickness of 100 nm, the chamber backfilled with UHP $N_2$ to 140 mTorr did not show a discernible change in frequency, while the introduction of $O_2$ at 140 mTorr showed a rapid frequency shift of ~150 Hz. The frequencies along with the acoustic impedance changes upon exposure to gas were measured with a passive crystal monitor.

Ti getter's nitrogen reactivity means that Titanium films may react with the ultra-high purity Nitrogen used as a diluent, carrier, purge or a combination of these. However, as shown in FIG. 2, Nitrogen has a very low sticking coefficient and the adsorbed Nitrogen atoms can be easily displaced by Oxygen atoms. Generally, there is a known pecking order with Oxygen showing the highest affinity to Titanium. Same is true for the adsorbed water vapors released from chamber walls or generated as a result of the process chemistry. At room temperature, the oxygen atoms from water do not have the energy to overcome chemisorption barrier of Titanium surface and can be displaced by free Oxygen molecules. This means in the event of an air leak the oxygen present in the air should produce a mass gain in the film due to oxidation. Assuming a homogeneous metal film thickness, such mass gain is proportional to the oxidized area of the getter.

For a given thermal equilibrium (in other words partial pressure of oxygen and temperature), the leak detection sensitivity is proportional to the thickness and the roughness of the metal film. Also, a gain factor may exist between potential leaks originating upstream of the QCM sensor and the detected leak as such air leaks have to pass along the chamber walls and tubing coated with Titanium before it reaches the QCM sensor in the foreline location. Therefore, a leak detection signal observed on demand or any downward baseline trending observed during idle step of the chamber may indicate a larger leak originated upstream of the sensor, most likely degrading the Titanium Nitride layer on the wafers. Pre-configuring the foreline with two sensors separated by a known distance may allow qualitative estimation of the leak rate at the upstream location. If the leak originated downstream of the farthest sensor from the chamber, signals of reverse magnitude may be detected by the two sensors as the leak has to flow against the pressure gradient.

One of the benefits provided by this technique, in terms of time and resources, is providing the ability to run a ramp-test upon detecting a leak signal from the sensor to avoid false positives. If positive, running more wafers can be prevented. A ramp-test involves both or either: of a) heating the crystal to increase mobility of lattice defect and vacancies to increase oxidation rate; b) integrating signal bin over time to improve SNR. Current leak check methods are not real time, hence in the event of an ex-situ method indicating oxidation due to leak all wafers run from the last leak test may be scrapped. In other words current leak check methods are diagnostic in nature and needs to be run regularly to reduce potential scrap wafer quantity. Unlike the real time leak detection of the current technique, here; more wafers may have been run before intervention, resulting in expensive scraps. Also, in the current technique an event triggered special recipe (for example carrier gas stepped over the precursor ampule) can be called without loading a wafer in the chamber to confirm the leak.

Frequency shift on the QCM due to the absorption of oxygen can, if needed, be differentiated from frequency shift induced by the deposition of other materials, e.g. unconsumed precursor, reaction byproducts, by correlating QCM data with other information that indicate the state of the process chamber and the process itself. For example, process chambers are frequently pumped down to some base vacuum level prior to the transfer of a wafer in to or out of the chamber. During these intervals no process is being executed and, therefore, no process gases or reaction byproducts are expected. Wafer processing in a chamber can involve many different process steps to stabilize conditions for a wafer prior to introducing process gases that produce unconsumed precursor gases and reaction byproducts detectable by the QCM.

Figure 3:
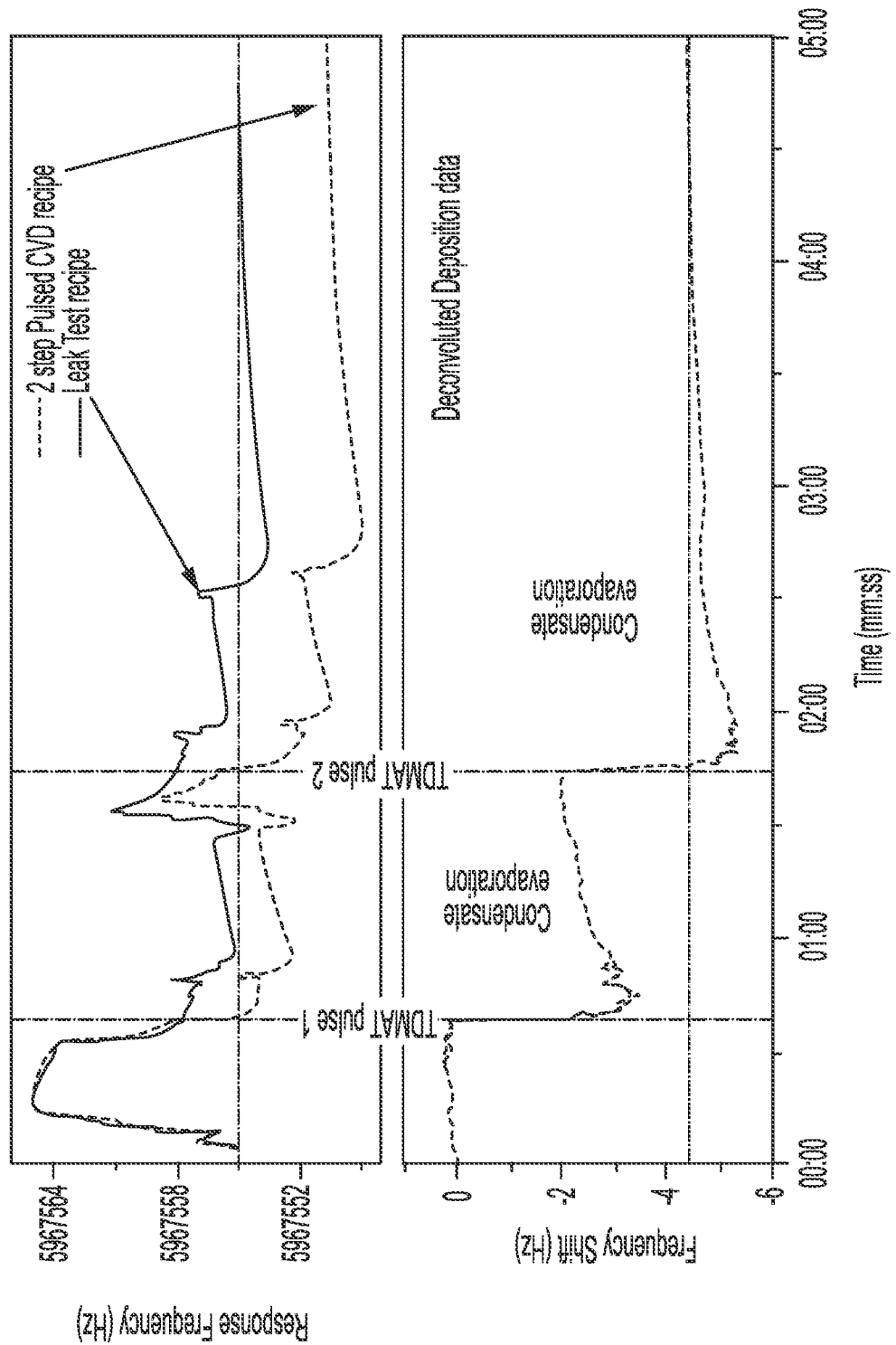
FIG. 3 is a graph of the frequency signature for a pulsed-CVD step for a tetrakis(dimethylamido)titanium (TDMAT) chamber.

In addition, some chamber air leak detection procedures involve simulating all process steps nearly exactly with the exception that the carrier gas (frequently used to transport precursor gas to the chamber) bypasses the precursor source ampule. FIG. 3 shows the frequency signature for a pulsed-CVD step for a TDMAT chamber. The black trace shows the frequency shift corresponding to Ti getter accumulation on the QCM surface. The red trace shows the same recipe without the presence of TDMAT precursor. During these test, no frequency shift as measured by the QCM would be expected due to process gases. If there is any shift it is related to an air leak, the source of the air leak may be inferred from contextual information provided from other coincidental chamber state data or isolated by controlled simulation of the valves involved and monitoring the QCM's resonance frequency. The leak detector pertaining to the data shown in FIG. 3 is mounted on the exhaust line and the frequency signature mimics the foreline pressure swings which are normal for an AT-cut crystal. The sensitivity to pressure can be reduced using an SC-cut crystal.

FIG. 3 is a graph of the frequency signature for a pulsed-CVD step for a tetrakis(dimethylamido)titanium (TDMAT) chamber. The black trace in the top graph shows the response of a QCM mounted in the exhaust line for a two-step TDMAT based CVD recipe. The red trace is the response of QCM for a leak check recipe with no TDMAT in the carrier gas. As the QCM already has accumulated ~100 nm of Ti a detectable air leak introduced to the chamber should result in a non-zero frequency shift.

The bottom graph in FIG. 3 shows the de-convoluted frequency signal indicating two steps of Ti vapor condensation and TDMAT condensate accumulation, and the subsequent evaporation of TDMAT condensations.

The getter metal is accumulatively refreshed during wafer cycling, hence maintaining a fresh Ti surface all the time. In the case of a non-getter process, Titanium sublimation as in Titanium sublimation pump can be used to coat the QCM with the Ti getter material. Alternatively, or in addition to all of the above, the getter coating can be generated by flowing process gases available on the process equipment for the specific intention of coating the crystal independently of wafer process. In other words, the getter coating on the QCM does not have to rely on unconsumed precursor that results from wafer process; it can be had by special chamber recipes that deliver process gas to the QCM for the express purpose of coating the crystal or other localized depositions such as sublimating Ti from a filament or titanium coated filament or etching the resident oxide scale on the QCM away to expose fresh layer of pure titanium. The flow path of process gas can be provided through the chamber, through precursor bypass or divert lines or through any other flow path that is available or can be created for the specific purpose of making process gas available to renew the getter coating on the QCM if needed.

Figure 4:
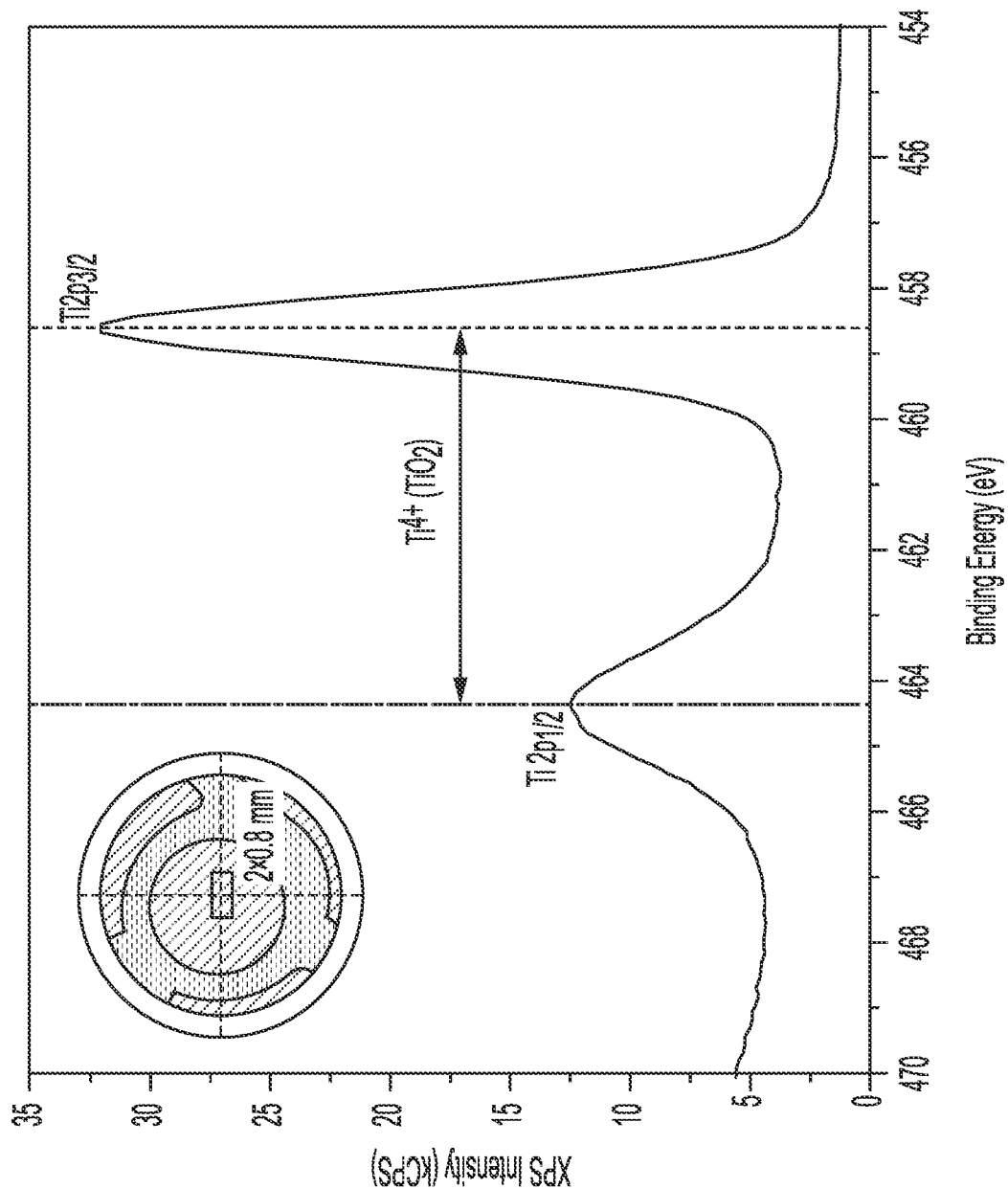
FIG. 4 is a graph of high resolution binding energy data obtained with X-ray photoelectron spectroscopy (XPS) for a 14 mm QCM sensor.

FIG. 4 is a graph of high resolution binding energy data obtained with X-ray photoelectron spectroscopy (XPS) for a 14 mm QCM sensor. High Resolution XPS binding energy data shows the presence of Ti $O_2$ on a QCM sensor used in the exhaust line of TiNi pulsed-CVD chamber. The XPS analysis was done on the center area of the QCM as shown. Both the front and back electrode of the QCM used in this example was aluminum. The $O_2$ was introduced through an accidental air leak to the exhaust line.

TABLE 1

Atomic Concentrations (in atomic %) normalized to 100% of the elements detected. A dash line indicates the element was not detected. For the front side center, the scan was done for the small rectangle marked on the Ti coating.

| Scanned area | C | N | O | F | Al | Si | Cl | Ti |
|---|---|---|---|---|---|---|---|---|
| Quartz disk, front side center | 33.8 | 2.8 | 39.2 | 9.4 | — | 0.4 | — | 14.5 |
| Quartz disk, back side, quartz area | 19.3 | 0.8 | 52.5 | — | — | 27.5 | — | — |
| Quartz disk, back side center | 37.3 | 0.6 | 39.6 | 0.9 | 21.5 | — | 0.1 | — |

FIG. 4 shows the high resolution binding energy data obtained with X-ray photoelectron spectroscopy (XPS) for a 14 mm QCM used in the foreline of a 300 mm TiN pulsed CVD chamber. This was done to verify if there was any ligand incorporation and to obtain the composition of elements forming the film. The peaks in the graph are for the scan region 2.0×0.8 mm rectangle shown in the center of the crystal (inset to FIG. 4). The thin film interference on the front face of crystal hints the presence of a dielectric film on the accumulated Ti coating. High resolution XPS scan of the fast scan 2p peak of Titanium revealed that the scale on the metal is made of Ti $O_2$. Using the net frequency shift and the density of Ti, the thickness of Ti layer was derived to be ≅500 nm. Using the relative amplitudes of the peaks in FIG. 4, the scale thickness was derived to be ≅3 nm. The backside center was predominately Aluminum which is the material used for QCM electrodes and the quartz region was confirmed as quartz. Table 1 shows the composition of element in the different areas of the crystal. The scan on the backside was performed to see if there is any film formation that can skew the mass gain as a QCM is sensitive for mass loading on both the front and back surfaces. Table 1 showed there no deposition on the backside.

Figure 5:
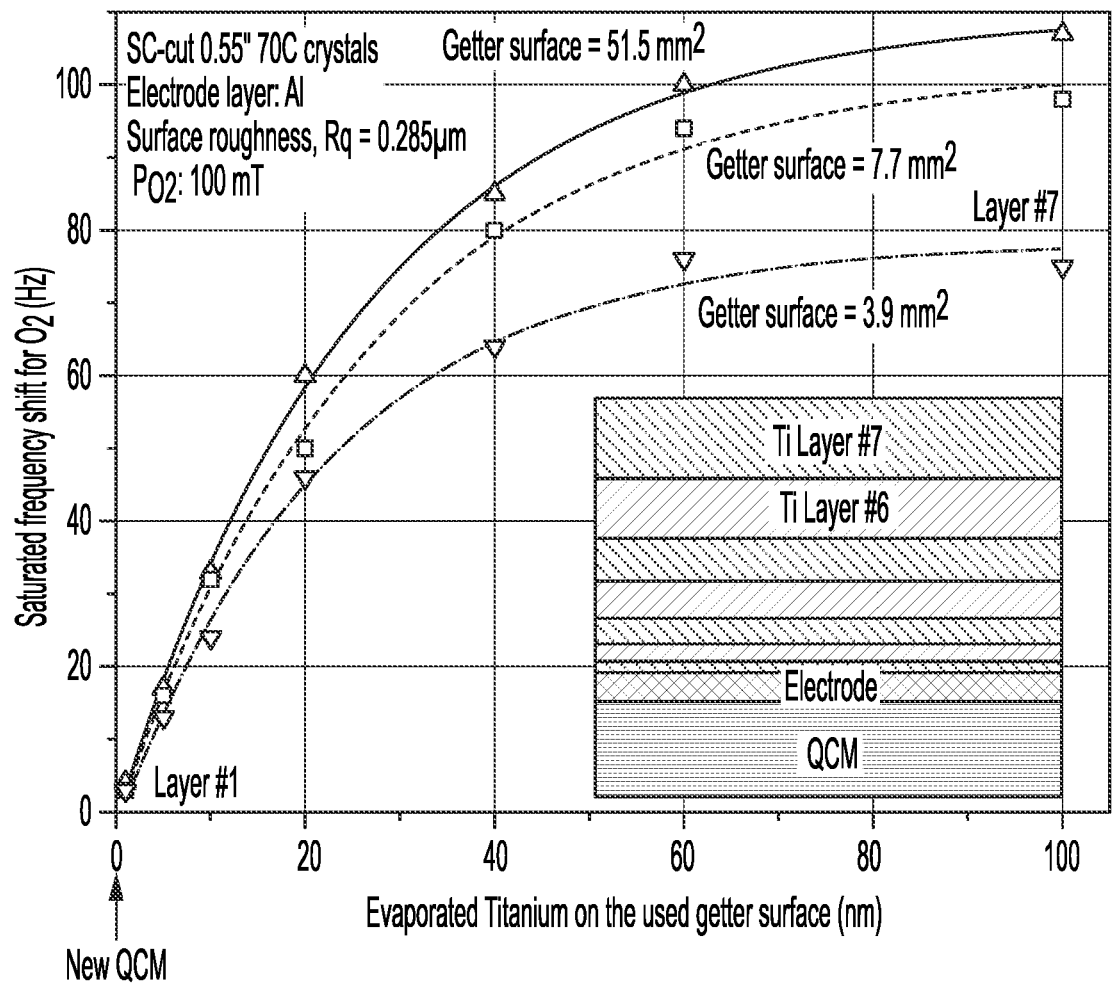
FIG. 5 is a graph of the frequency shift corresponding to total mass gain of titanium films upon exposing to ultra-high purity (UHP) oxygen as a function of starting pure Ti thickness and the area.

FIG. 5 is a graph of the frequency shift corresponding to total mass gain of titanium films upon exposing to ultra-high purity (UHP) oxygen as a function of starting pure Ti thickness and the area. $O_2$ chemisorption on evaporated Titanium as a function of Pure Titanium coating thickness. The curves show that the total number of atoms chemisorbed by the getter converges with film thickness. The different curves correspond to different area sizes of getter coating. As the QCM is designed to operate under energy trapped mode, mass gain of films outside the active area does not result in a resonance frequency change.

FIG. 5 shows frequency shift corresponding to total mass gain of Titanium films upon exposing to UHP oxygen as a function of starting pure Ti thickness and the area. The test was done at room temperature for an oxygen gas pressure of 140 mT. Each data point indicates the total frequency shift (or the total mass gain) for the given film thickness. The Titanium film was applied using eBeam evaporation at 1-1.5 A/s rate. The three different curves are for different metal coating areas on the active region of three different crystals. This illustrates the minimum area that needs to be covered to get the most frequency shift. As the crystals used are plano-convex, the acoustic energy is trapped only in the center and for that reason the same mass gain sensitivity to air exposure can be obtained regardless of the lateral dimension of the crystal. In other words, crystals of smaller size such as 8 mm in diameter can be used in smaller nipples available in semi tools without losing the sensitivity. As shown in the coating stack of figure, the same crystal was maintained to derive exposure data for all metal thicknesses for a given metal area.

Figure 6:
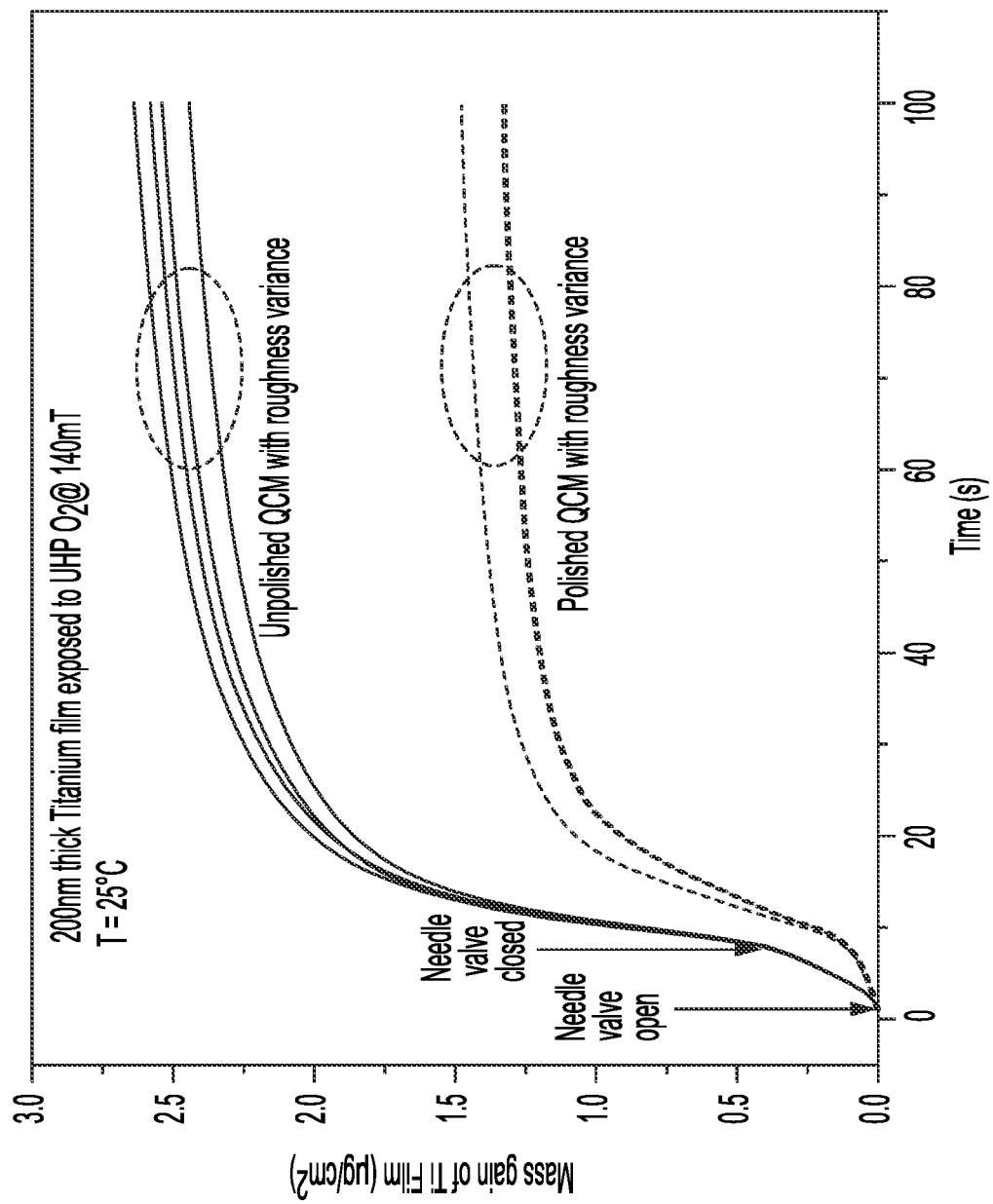
FIG. 6 is a graph of the mass gain of titanium films upon exposure to ultra-high purity (UHP) oxygen.

FIG. 6 is a graph of the mass gain of titanium films upon exposure to ultra-high purity (UHP) oxygen. Mass gain of Ti film on QCM upon exposure to UHP $O_2$. The two sets of curves correspond to 200 nm thick evaporated Ti on polished and unpolished QCM substrates. To avoid film morphology being the dominating factor of the final surface roughness of the film, an evaporation rate of 1.5 A/s was used. The variation among a set is mainly due to variance in Ti coating thickness.

The effect of the metal film's morphology on the amount of oxygen uptake at a pressure of 140 mT and at room temperature was tested using two groups of QCMs with different Ti surface roughness. Both groups were 14 mm in diameter and had a starting fundamental frequency around 6 MHz. The metal film thickness and the evaporation rate were selected to ensure that the metal surface roughness film conforms to the underlying surface roughness of the substrate. Mean surface roughness measured for the unpolished and the polished substrates have a mean root mean square height of Sq≅0.285 μm and Sq≅50 A, respectively. The variation among a set is due to roughness variance for both polished and unpolished crystals. As expected and as shown in FIG. 6, the mass gain of the unpolished QCM is larger than for the polished QCMs. To ensure that the grain morphology does not dominate the surface roughness an upper limit rate of 1.5 A/s was maintained during all depositions on both types of crystals. The room temperature oxidation kinetics is expected to be the same in both cases. Therefore, the increased gain is attributed to the large surface area available due to valleys and pits on the metal film on unpolished crystals.

Figure 7A:
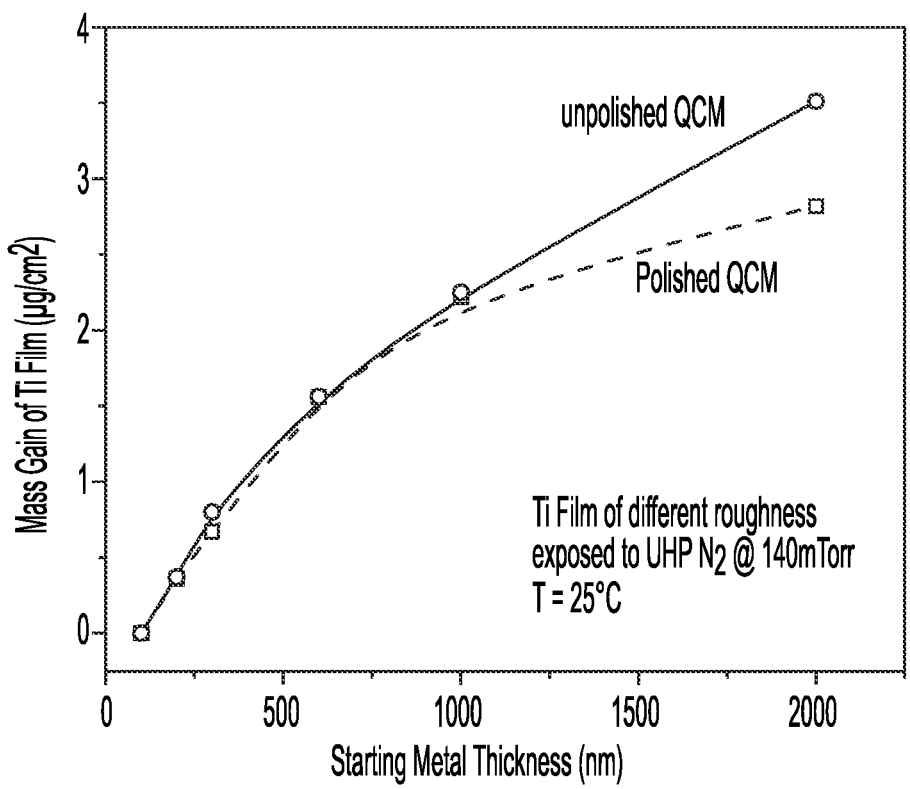
FIGS. 7A and 7B are graphs of the mass gain of titanium films upon exposure to $O_2$ and $N_2$.
Figure 7B:
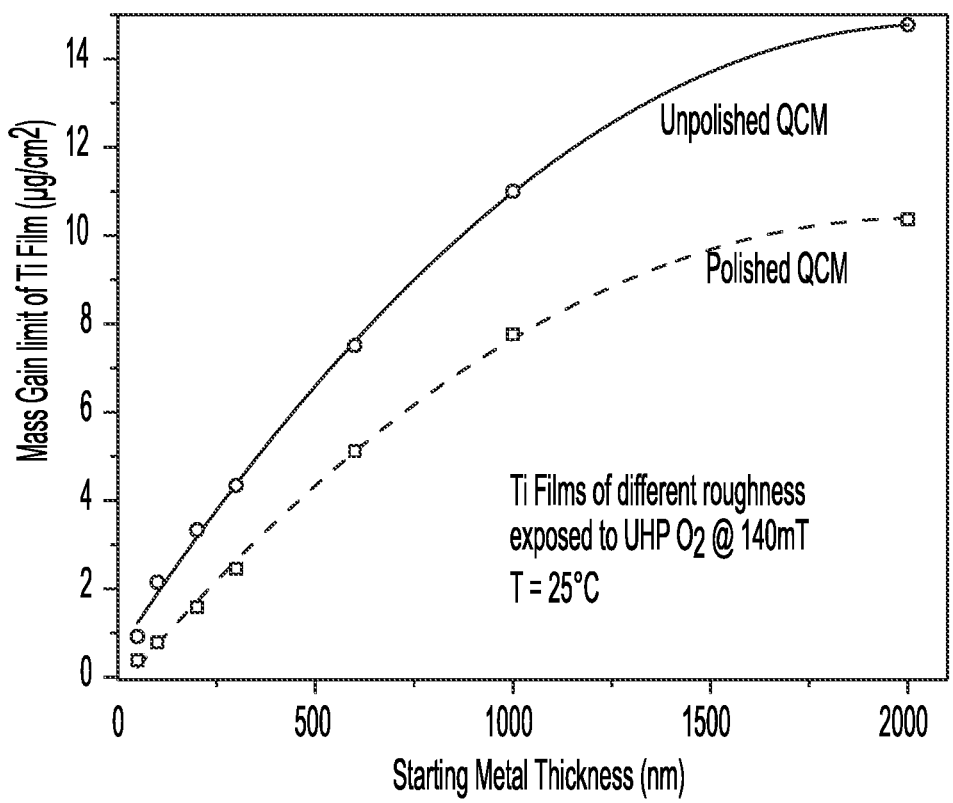

FIGS. 7A and 7B are graphs of the mass gain of titanium films upon exposure to $O_2$ and $N_2$, respectively. Total mass Gain vs. starting metal thickness for Pure Ti exposed to UHP $N_2$ and UHP $O_2$ for polished and unpolished crystals. Metal was evaporated at 1.5 A/s. The QCMs were at room temperature before exposed.

The mass gain of pure Titanium films upon exposure to UHP $N_2$ first and to UHP $O_2$ second at 140 mT and at room temperature was tested as a function of starting Ti metal thickness. As shown in FIG. 7, the experiment was done for both polished and unpolished crystals. As both the sticking coefficient and the affinity to Ti is larger for $O_2$ molecules compared to $N_2$ molecules, the frequency shift upon exposure to $O_2$ is larger under similar conditions for $N_2$. For both oxygen and nitrogen there is a thickness limit of Ti and beyond this thickness no additional uptakes will occur. For any given thickness, the oxidation takes place by diffusion of cation interstitials and vacancies through the oxide layer to the oxide gas interface. Mass Gain saturation indicates that there is no more free energy available for cations to react with oxygen. The y-axis of the graphs translates to the total amount of oxygen or nitrogen molecules that can react before reaching saturation. Total oxygen uptake is also a function of partial pressure and the temperature of the metal film.

Figure 8A:
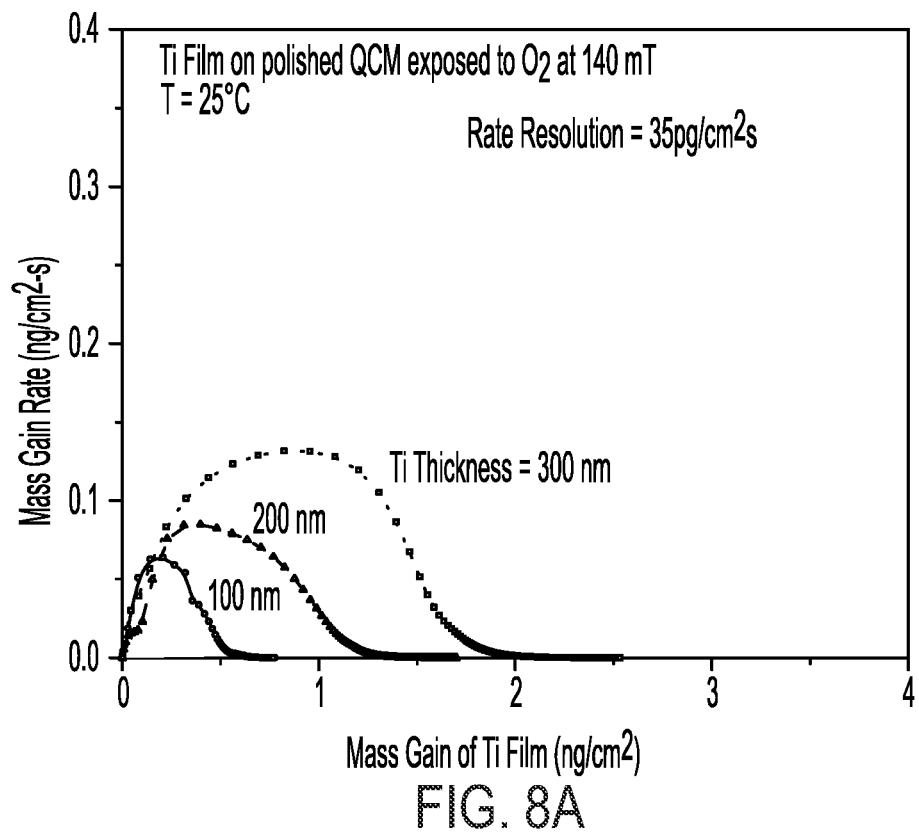
FIGS. 8A and 8B are graphs of mass gain rates as a function of mass gain for $O_2$ and $N_2$.
Figure 8B:
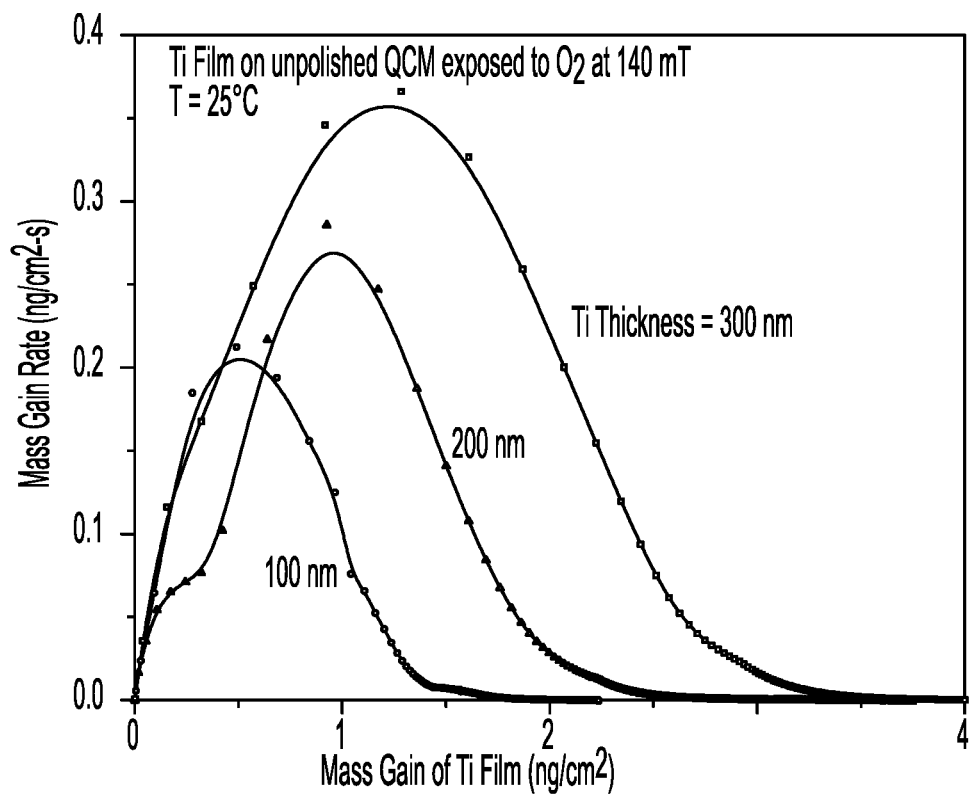

FIG. 8 are graphs of mass gain rates as a function of mass gain for $O_2$ and $N_2$, respectively. Mass gain rate of Ti film upon exposure to UHP $O_2$ at 140 mT and T=25 C. The two sets of curves correspond to Ti Films on polished and unpolished QCMs. The curves are for original Ti Thickness of 100, 200, 300 nm. To avoid film morphology being the dominating factor of the final surface roughness of the film, an evaporation rate of 1.5 A/s was used. The x-axis is proportional to Oxide thickness. Unlike in the high temperature growth kinetics, the peak rate of oxidation was observed when the oxide has grown to half of final thickness attainable.

Mass gain rates as a function of mass gain for $O_2$ and $N_2$ are shown in FIG. 8. The growth rate curves show that the room temperature oxidation kinetics does not follow the parabolic rate law as in high temperature metal oxidation. At room temperature, the mass gain rate increased with the oxide thickness and tends to decrease towards zero at saturation. The instrument used to measure the resonance frequency of the crystal has a frequency resolution of 3.5 mHz and the crystals used in the tests have a mass sensitivity of approx. 10 ng/cm$^2$. Therefore, the instrument resolutions translate to mass gain rate resolution of 35 pg/cm$^2$-s or $8 \times 10^{10}$ $O_2$ molecules/s. The extension of the x-value shows the $O_2$ uptake limit for a given thickness or roughness values.

The mass gain of pure Titanium films upon exposure to $O_2$ at 140 mT and T=25 C was tested as a function of starting Ti pure metal thickness. As shown in FIG. 8, the experiment was done for both polished and unpolished crystals. Unlike the parabolic rate law or as predicted by the Wagner's theory for high temperature oxidation kinetics, the mass gain rate increased with the oxide thickness and started to decrease towards zero at saturation. The instrument used to measure the resonance frequency of the crystal has a frequency resolution of 3.5 mHz and the crystals used in the tests have a mass sensitivity of approx. 10 ng/cm$^2$. Therefore, the instrument resolutions translate to mass gain rate resolution of 35 pg/cm$^2$·s or $8 \times 10^{10}$ $O_2$ molecules/s. The extension of the x-value shows the $O_2$ uptake limit for a given thickness or film roughness.

Figure 9A:
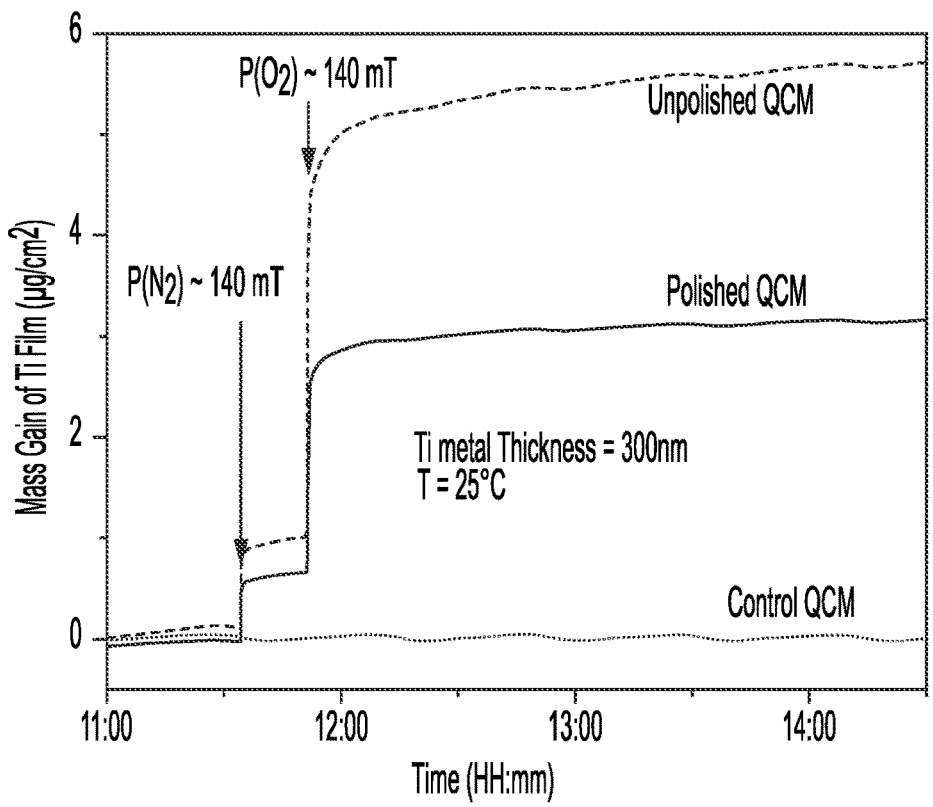
FIGS. 9A and 9B are graphs of the affinity and displacement ability of gas molecules to Ti metal films, with FIG. 9A showing the results for a 300 nm thick Ti film exposed to UHP $N_2$ at 140 mT followed by UHP $O_2$ at 140 mT and FIG. 9B showing the results for the reverse experiment on a new Ti metal layer.
Figure 9B:
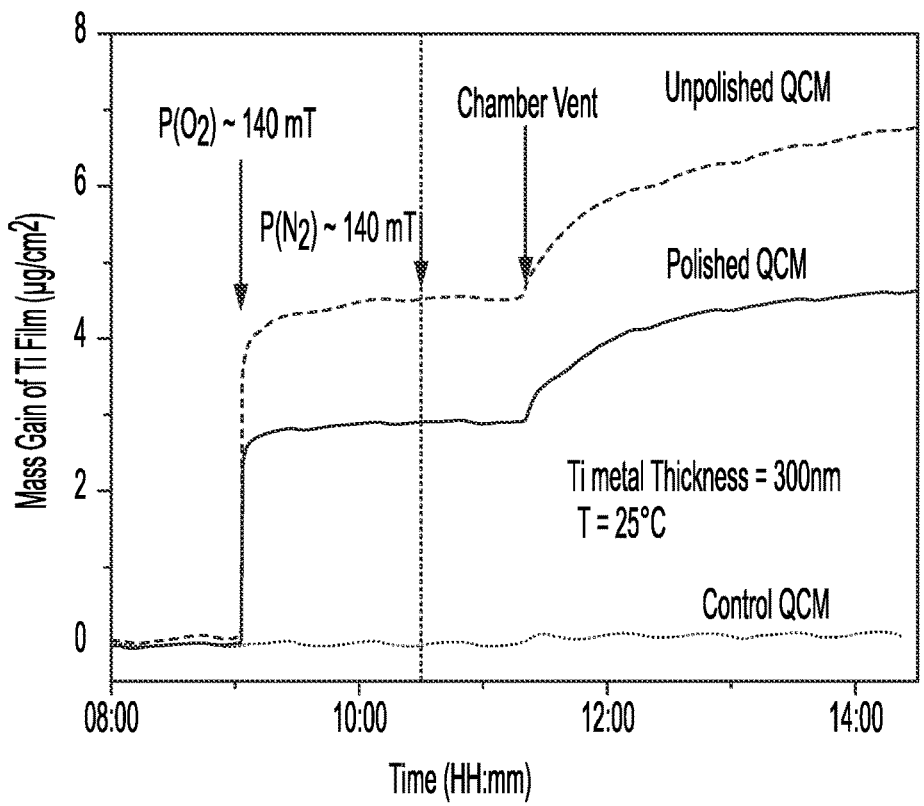
Figure 10:
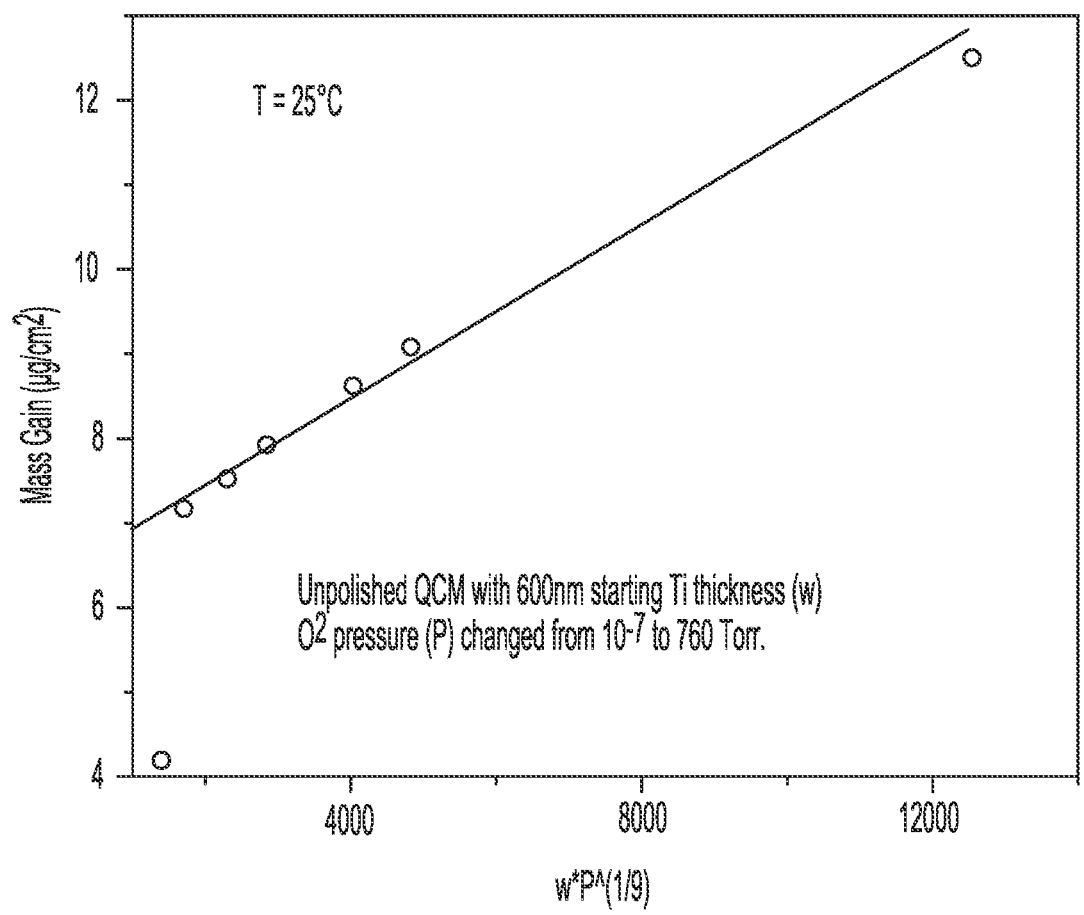
FIG. 10 is a graph of the total mass gain attainable as a function of original pure getter thickness and the oxygen gas pressure.

FIGS. 9A and 9B are graphs of the affinity and displacement ability of gas molecules to Ti metal films, with FIG. 9A showing the results for a 300 nm thick Ti film exposed to UHP $N_2$ at 140 mT followed by UHP $O_2$ at 140 mT and FIG. 9B showing the results for the reverse experiment on a new Ti metal layer. Affinity and displacement ability of $O_2$ molecules to Ti metal films. On the left, 300 nm thick Ti film exposed to UHP $N_2$ at 140 mT followed by UHP $O_2$ at 140 mT. FIG. 9B shows the reverse experiment on a new Ti metal layer. In between the two exposures the chamber was pumped down to a base vacuum of mid 10$^{-7}$ Torr. FIG. 9A does not have a vent event FIG. 10 is a graph of the total mass gain attainable as a function of original pure getter thickness and the oxygen gas pressure. Mass gain of 600 nm Thick Ti film at room temperature upon exposure to different $O_2$ pressures. The total oxide growth increases as a function of $O_2$ pressure. A similar plot can be obtained for fixed pressure with different getter metal thickness.

A similar curve can be obtained for air pressure. Under point lattice defect diffusional control (diffusion of cation interstitials and vacancies through the oxide thickness reaching the oxide gas interface) theory by Wagner, the differential lattice defect diffusion current reaches zero for a given pressure and temperature thereby limiting the oxide growth to a final oxide layer thickness, irreversibly. However, when the oxidizing gas pressure increase the chemical potential equilibrium is broken and there will be more diffusional flow until a new final thickness is attained. In other words, the oxygen uptake capacity for given Ti layer (or any other getter) thickness increases with the oxygen partial pressure.

Figure 11:
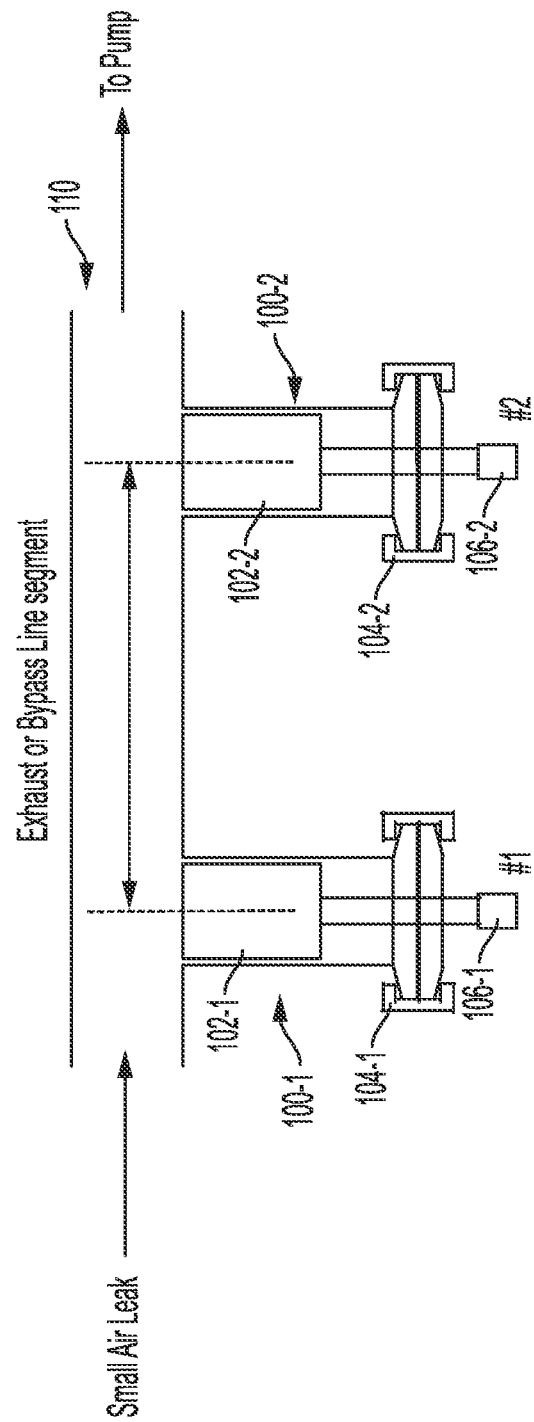
FIG. 11 is an embodiment of a differential leak detection system.

FIG. 11 is an embodiment of a differential leak detection system. QCM #1 is at T1 temperature and QCM #2 is at T2 temperature. T2 is about an order of magnitude larger than T1, for example T1≅40 C and T2≅350 C. The temperatures are maintained using a process controller optionally connected in series to the resonance frequency monitor circuit. Optionally, the crystal cut for the two different temperatures may be selected to give greater frequency stability. QCM #2 can be mounted downstream of QCM #1 and the spacing between the two can be between 5-10 inches. Reference is made to the equations below: For planned leak checks, two signal bins for the two QCMs can be defined to integrate the respective frequencies during equipment idle or on-demand leak check recipe calls. Here, T is the integration time of the frequencies. If a leak is present, $S_{\#2}$ will be large compared to $S_{\#1}$. The magnitude of differential signal is a function of the leak rate and may be used, empirically, to derive the leak rate.

$$S_{\#1}(T_1, x_{O2}) = \int_0^T \left(\frac{d}{dt}f\right)_{\#1} dt$$

$$S_{\#2}(T_2, x_{O2}) = \int_0^T \left(\frac{d}{dt}f\right)_{\#2} dt$$

$$\Delta S(T_1, T_2, x_{O2}) = \int_0^T \left(\left(\frac{d}{dt}f\right)_{\#1} - \left(\frac{d}{dt}f\right)_{\#2}\right) dt$$

The technique as described so far illustrates/demonstrates the capability of the chamber air-leak detection. The sensitivity of detection however is not enough to detect ppm levels of foreign air mixture in native gas environment of the chamber. In other words, QCMs maintained at room temperature are not sensitive to indicate ppm level $O_2$ in air leak in chamber. The following describes another aspect of the technique. A highly sensitive differential air leak detection arrangement is shown in FIG. 11. Here, there are two QCM that has same amount of Ti (or other getter material from the process precursor) accumulation. This is a useful arrangement for highly sensitive on—demand air-leak detection during chamber idles or in between wafer runs. In one method, activation of leak check routine triggers the temperature of the QCM #2 to be ramped to about 400 C while the temperature of QCM #1 is kept fixed. At the onset of ramp, a differential signal of the two frequency bins is recorded. If there is no leak the differential signal should only reflect the temperature coefficient of the crystals installed and can be readily compensated using a f-T data stored in a non-volatile memory of the measurement unit to derive a flat baseline. However, if the baseline still drifts, and more importantly, keeps drifting after the temperature of QCM #2 reaches steady state this indicates the differential $O_2$ molecules uptake by the Ti, hence the presence of an air-leak. If the differential signal is large compensation is not really needed. Depending on the size of the leak the integration time can be adjusted. This ramp experiment may provide very low detection limits as the lattice defect current density is much larger at high temperatures even for a small electrochemical potential difference caused by ppm level air to chamber gas mix ratio. Another advantage is that detection occurs even if the Ti surface was saturated prior to ramp test, for example surface Ti $O_2$ from the very leak that was present before the leak detection routine was intentionally performed. The integration time mentioned above gives a handle to design leak detection limits to the process engineer. The two sensors can also be used for detecting direction of leak and to approximate the leak rate. The differential signal's sign tells if the leak is upstream or downstream of the two sensors and the magnitude can be translated to leak rate.

In another example of the current technique with the ramp method, the two QCMs can be pre-coated with Ti getter before installing in fore-lines and bypass lines where the semi-process cannot provide metals with getter properties or the amount of accumulation is negligible. Also a single QCM can be used in ramp with an alternative signal accumulation method for leak detection.

The getter metal accumulation on QCM does not have to be passive. Active on demand accumulation can be done. For example, a source of getter material independent of tool/chamber assets that provides for the in situ regeneration of a getter material on a crystal surface. Such a source could be provided as an integral part of the QCM sensor, as a separate component, as a modification of the process tool/chamber or any combination of each. The source can be anything that is conceived for the purpose of providing an in situ means of coating the QCM including thermal decomposition, thermal evaporation, plasma deposition, sublimation, etc.

Alternatively, or in addition to the above, a quartz crystal pre-coated with a getter material prior to installation on or about a process chamber can be prepared when no process gas suitable to providing the getter material is available from the tool/chamber. Preparation of a QCM with a getter material presents the challenge of contamination from oxygen in air prior to installation of the QCM on the chamber for the purposes of detecting oxygen. Gettering surfaces can become inactive or desensitized by exposure to oxygen. In such cases, a contaminated QCM surface can be activated or reactivated in situ (post-installation) removal of the contaminated surface layer by the use of resources available on the process chamber such as reactive gases employed by the chamber for cleaning wafer surfaces and chamber walls, plasma systems otherwise used for wafer processing (etching, cleaning, deposition, etc.), heating or any other asset(s) that are available on the tool/chamber.

Returning to certain implementation details, a controller or processor can include a data processor or a central processing unit ("CPU"). The system data storage devices can include, but is not limited to, a hard drive with a spinning magnetic disk, a Solid-State Drive ("SSD"), a floppy disk, an optical disk (including, but not limited to, a CD or DVD), a Random Access Memory ("RAM") device, a Read-Only Memory ("ROM") device (including, but not limited to, programmable read-only memory ("PROM"), electrically erasable programmable read-only memory ("EPROM"), electrically erasable programmable read-only memory ("EEPROM"), a magnetic card, an optical card, a flash memory device (including, but not limited to, a USB key with non-volatile memory, any type of media suitable for storing electronic instructions or any other suitable type of computer-readable storage medium.

The method includes computer-readable instructions, algorithms and logic that are implemented with any suitable programming or scripting language, including, but not limited to, C, C++, Java, COBOL, assembler, PERL, Visual Basic, SQL, JMP Scripting Language, Python, Stored Procedures or Extensible Markup Language (XML). The method 30 can be implemented with any suitable combination of data structures, objects, processes, routines or other programming elements.

In an embodiment, the memory devices and data storage devices described above can be non-transitory mediums that store or participate in providing instructions to a processor for execution. Such non-transitory mediums can take different forms, including, but not limited to, non-volatile media and volatile media. Non-volatile media can include, for example, optical or magnetic disks, flash drives, and any of the storage devices in any computer. Volatile media can include dynamic memory, such as main memory of a computer. Forms of non-transitory computer-readable media therefore include, for example, a floppy disk, flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read programming code and/or data. Many of these forms of computer readable media may be involved in carrying one or more sequences of one or more instructions to a processor for execution. In contrast with non-transitory mediums, transitory physical transmission media can include coaxial cables, copper wire and fiber optics, including the wires that comprise a bus within a computer system, a carrier wave transporting data or instructions, and cables or links transporting such a carrier wave. Carrier-wave transmission media can take the form of electric or electromagnetic signals, or acoustic or light waves such as those generated during RF and IR data communications.

It should be appreciated that at least some of the subject matter disclosed herein includes or involves a plurality of steps or procedures. In an embodiment, as described, some of the steps or procedures occur automatically or autonomously as controlled by a processor or electrical controller without relying upon a human control input, and some of the steps or procedures can occur manually under the control of a human. In another embodiment, all of the steps or procedures occur automatically or autonomously as controlled by a processor or electrical controller without relying upon a human control input. In yet another embodiment, some of the steps or procedures occur semi-automatically as partially controlled by a processor or electrical controller and as partially controlled by a human.

It should also be appreciated that aspects of the disclosed subject matter may be embodied as a method, device, assembly, computer program product or system. Accordingly, aspects of the disclosed subject matter may take the form of an entirely hardware embodiment, an entirely software embodiment (including firmware, resident software, micro-code, etc.), or an embodiment combining software and hardware aspects that may all, depending upon the embodiment, generally be referred to herein as a "service," "circuit," "circuitry," "module," "assembly" and/or "system." Furthermore, aspects of the disclosed subject matter may take the form of a computer program product embodied in one or more computer readable mediums having computer readable program code embodied thereon.

Aspects of the disclosed subject matter are described herein in terms of steps and functions with reference to flowchart illustrations and block diagrams of methods, apparatuses, systems and computer program products. It should be understood that each such step, function block of the flowchart illustrations and block diagrams, and combinations thereof, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create results and output for implementing the functions described herein.

These computer program instructions may also be stored in a computer readable medium that can direct a computer, other programmable data processing apparatus, or other devices to function in a particular manner, such that the instructions stored in the computer readable medium produce an article of manufacture including instructions which implement the functions described herein.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions described herein.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

What is claimed is:

1. A monitoring device for monitoring a fabrication process in a fabrication system, the fabrication system comprising a process chamber and a plurality of flow components, and the monitoring device comprising:

a quartz crystal microbalance (QCM) sensor for monitoring one flow component of the plurality of flow components of the fabrication system and configured for exposure to a process chemistry in the one flow component during the fabrication process, the QCM sensor comprising a material layer, the material layer being accumulated in situ on the QCM sensor during the fabrication process; and a controller for:
measuring resonance frequency shifts of the QCM sensor due to interactions between the material layer of the QCM sensor and the process chemistry in the one flow component during the fabrication process; and determining a parameter of the fabrication process in the process chamber as a function of the measured resonance frequency shifts of the QCM sensor within the one flow component;

wherein the fabrication process comprises accumulating a material layer on a substrate, wherein the material layer on the substrate is the same material as the material layer of the QCM sensor.

2. The monitoring device of claim 1, wherein the determined parameter of the fabrication process indicates one or more of an air leak, a reaction byproduct, an unconsumed precursor, or a contaminant in the process chamber.

3. The monitoring device of claim 1, wherein the one flow component comprises one of a pumping line, an exhaust line, a supply line, a bypass line, a valve body, a vacuum plenum, a bypass chamber or a transfer chamber.

4. The monitoring device of claim 1, further comprising a getter material disposed on the QCM sensor, wherein a mass of the getter material changes due to the interactions with the process chemistry in the one flow component during the fabrication process, and the controller determines an air leak in the process chamber due to the measured resonance frequency shifts of the QCM sensor indicating the changing mass of the getter material in the one flow component.

5. The monitoring device of claim 4, wherein the controller is further configured to divert a fabrication chemistry from the fabrication system to the QCM sensor to dispose the getter material with a specified thickness on the QCM sensor.

6. The monitoring device of claim 4, further comprising a sacrificial layer disposed above the getter material, wherein the controller is further configured to use the fabrication system to remove the sacrificial layer after installation of the QCM sensor in the fabrication system.

7. The monitoring device of claim 4, further comprising a specific component for providing material on the QCM sensor, wherein the controller is further configured to use the specific component to dispose the getter material with a specified thickness on the QCM sensor.

8. The monitoring device of claim 4, further comprising a specific component for removing material on the QCM sensor, wherein the controller is further configured to use the specific component to remove a sacrificial layer after installation of the QCM sensor in the fabrication system.

9. The monitoring device of claim 4, further comprising a heating device for heating the QCM sensor, wherein the controller is further configured to use the heating device to increase a temperature of the QCM sensor above a previous temperature of the QCM sensor to reactivate the getter material.

10. The monitoring device of claim 1, wherein the process chemistry in the one flow component during the fabrication process comprises at least one of an unconsumed precursor or a reaction byproduct of the fabrication process in the process chamber, and a mass of the QCM sensor changes due to the unconsumed precursor or the reaction byproduct, and the controller determines the parameter of the fabrication process in the process chamber due to the measured resonance frequency shifts of the QCM sensor indicating the changing mass of the QCM sensor.

11. The monitoring device of claim 10, wherein the fabrication process comprises a deposition process, and the parameter comprises a deposition rate in the process chamber.

12. The monitoring device of claim 10, wherein the fabrication process comprises a material removal process, and the parameter comprises a material removal rate in the process chamber.

13. The monitoring device of claim 1, further comprising a heating device for adjusting a temperature of the QCM sensor to facilitate the interactions with the process chemistry in the one flow component during the fabrication process.

14. The monitoring device of claim 13, wherein the temperature of the QCM sensor is selected to initiate or control deposition on the QCM sensor by the process chemistry in the one flow component.

15. The monitoring device of claim 13, wherein the temperature of the QCM sensor is selected to initiate or control removal of material on the QCM sensor by the process chemistry in the one flow component.

16. The monitoring device of claim 1, further comprising an apparatus for limiting exposure of the QCM sensor to the process chemistry in the one flow component during the fabrication process to reduce the interactions between the QCM sensor and the process chemistry.

17. The monitoring device of claim 16, wherein the apparatus for limiting exposure of the QCM sensor to the process chemistry comprises a valve or orifice.

18. The monitoring device of claim 16, wherein the apparatus for limiting exposure of the QCM sensor to the process chemistry comprises a dilution gas line for diluting the process chemistry.

19. The monitoring device of claim 1, wherein the controller further determines the parameter of the fabrication process in the process chamber as a function of a state of the fabrication system.

20. A monitoring device for monitoring a fabrication process in a fabrication system, the fabrication system comprising a process chamber and a plurality of flow components including an exhaust line or a supply line, and the monitoring device comprising:
   a quartz crystal microbalance (QCM) sensor for monitoring the exhaust line or the supply line of the plurality of flow components of the fabrication system and configured for exposure to a process chemistry in the exhaust line or the supply line during the fabrication process, the QCM sensor comprising a material layer, the material layer being accumulated in situ on the QCM sensor during the fabrication process; and
   a controller for:
      measuring resonance frequency shifts of the QCM sensor due to interactions between the QCM sensor and the process chemistry including a precursor gas in the exhaust line or the supply line during the fabrication process for depositing the material of the precursor gas on wafers; and
      determining a parameter of the fabrication process in the process chamber as a function of the measured resonance frequency shifts of the QCM sensor within the exhaust line or the supply line, wherein the exhaust line or the supply line during the fabrication process comprises an unconsumed portion of the precursor gas in the process chamber, and a mass of the QCM sensor changes due to the unconsumed portion of the precursor gas interacting with the material layer of the QCM sensor, and the controller determines the parameter of the fabrication process in the process chamber due to the measured resonance frequency shifts of the QCM sensor indicating the changing mass of the QCM sensor;
      wherein the fabrication process comprises accumulating a material layer on a substrate, wherein the material layer on the substrate is the same material as the material layer of the QCM sensor.

21. A method for monitoring a fabrication process in a fabrication system, the fabrication system comprising a process chamber and a plurality of flow components, and the method comprising:
   deploying a quartz crystal microbalance (QCM) sensor for monitoring one flow component of the plurality of flow components of the fabrication system;
   accumulating a material layer on the QCM sensor in situ during the fabrication process;
   exposing the QCM sensor to a process chemistry in the one flow component during the fabrication process;
   measuring resonance frequency shifts of the QCM sensor due to interactions between the material layer of the QCM sensor and the process chemistry in the one flow component during the fabrication process; and
   determining a parameter of the fabrication process in the process chamber as a function of the measured resonance frequency shifts of the QCM sensor within the one flow component
      wherein the fabrication process comprises accumulating a material layer on a substrate, wherein the material layer on the substrate is the same material as the material layer of the QCM sensor.

22. The method of claim 21, wherein the material layer of the QCM sensor comprises a getter material disposed on the QCM sensor during the fabrication process, wherein a mass of the getter material changes due to the interactions with the process chemistry in the one flow component during the fabrication process;
   determining an air leak in the process chamber due to the measured resonance frequency shifts of the QCM sensor indicating the changing mass of the getter material in the one flow component; and
   refreshing the getter material of the QCM sensor during the fabrication process.

* * * * *